United States Patent
Lin et al.

(10) Patent No.: US 12,272,605 B2
(45) Date of Patent: *Apr. 8, 2025

(54) METHODS OF FORMING CONTACT FEATURES IN FIELD-EFFECT TRANSISTORS

(71) Applicant: Taiwan Semiconductor Manufacturing Co., Ltd., Hsin-Chu (TW)

(72) Inventors: Yi-Hsiung Lin, Hsinchu County (TW); Yi-Hsun Chiu, Hsinchu County (TW); Shang-Wen Chang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/336,168

(22) Filed: Jun. 16, 2023

(65) Prior Publication Data

US 2023/0326808 A1    Oct. 12, 2023

Related U.S. Application Data

(60) Continuation of application No. 17/391,271, filed on Aug. 2, 2021, now Pat. No. 11,682,590, which is a
(Continued)

(51) Int. Cl.
| | |
|---|---|
| *H01L 21/8238* | (2006.01) |
| *H01L 21/762* | (2006.01) |
| *H01L 21/768* | (2006.01) |
| *H01L 23/522* | (2006.01) |
| *H01L 27/092* | (2006.01) |
| *H01L 29/08* | (2006.01) |

(Continued)

(52) U.S. Cl.
CPC ........... *H01L 21/823871* (2013.01); *H01L 21/76224* (2013.01); *H01L 21/76831* (2013.01);
(Continued)

(58) Field of Classification Search
None
See application file for complete search history.

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| | (Continued) | |

FOREIGN PATENT DOCUMENTS

CN    106611712 A    5/2017

OTHER PUBLICATIONS

English translation of CN 106611712 (Year: 2017).*

*Primary Examiner* — Xiaoming Liu
(74) *Attorney, Agent, or Firm* — HAYNES AND BOONE, LLP

(57) ABSTRACT

A semiconductor structure includes a first semiconductor fin and a second semiconductor fin adjacent to the first semiconductor fin. The first and the second semiconductor fins extend lengthwise along a first direction over a substrate. A metal gate structure is disposed over the first and second semiconductor fins, the metal gate structure extending lengthwise along a second direction perpendicular to the first direction. A first epitaxial source/drain (S/D) feature is disposed over the first semiconductor fin, and a second epitaxial S/D feature is disposed over the second semiconductor fin. An interlayer dielectric (ILD) layer is disposed over the first and the second epitaxial S/D features. And an S/D contact is disposed directly above the first and second epitaxial S/D features. The S/D contact directly contacts the first epitaxial S/D feature, and the S/D contact is isolated from the second epitaxial S/D feature by the ILD layer.

20 Claims, 15 Drawing Sheets

Related U.S. Application Data division of application No. 16/393,543, filed on Apr. 24, 2019, now Pat. No. 11,081,403.

(60) Provisional application No. 62/691,800, filed on Jun. 29, 2018.

(51) Int. Cl.
*H01L 29/66* (2006.01)
*H01L 29/78* (2006.01)

(52) U.S. Cl.
CPC ........ *H01L 21/76832* (2013.01); *H01L 21/823814* (2013.01); *H01L 21/823821* (2013.01); *H01L 21/823878* (2013.01); *H01L 23/5226* (2013.01); *H01L 27/0924* (2013.01); *H01L 29/0847* (2013.01); *H01L 29/6681* (2013.01); *H01L 29/7851* (2013.01); *H01L 2029/7858* (2013.01)

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 11,682,590 B2* | 6/2023 | Lin | H01L 21/76831 257/288 |
| 2015/0076609 A1* | 3/2015 | Xie | H01L 23/528 257/365 |
| 2015/0129961 A1* | 5/2015 | Li | H01L 21/823475 438/587 |
| 2018/0166571 A1 | 6/2018 | Liu et al. | |
| 2018/0374750 A1 | 12/2018 | Zhang et al. | |

\* cited by examiner

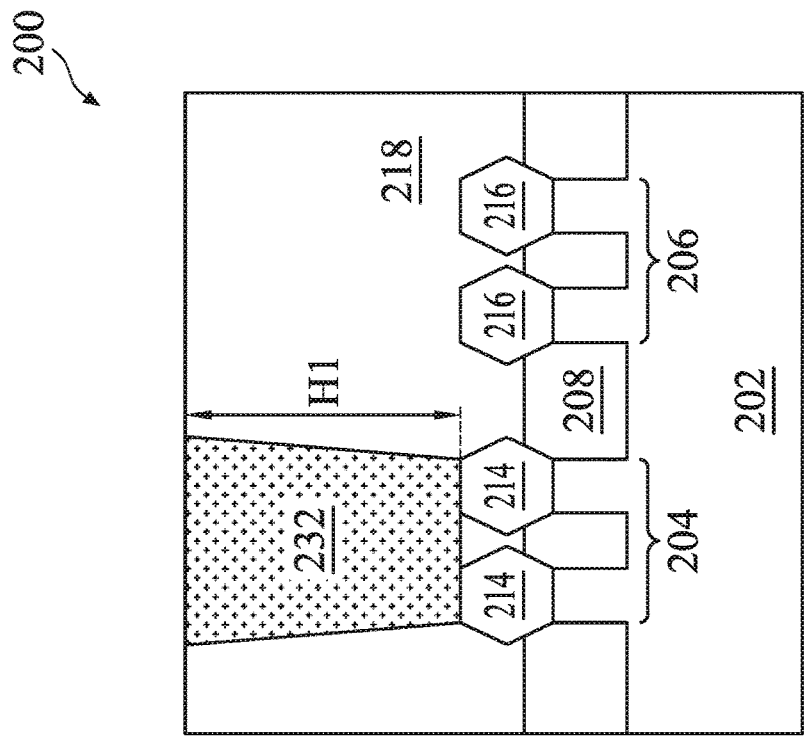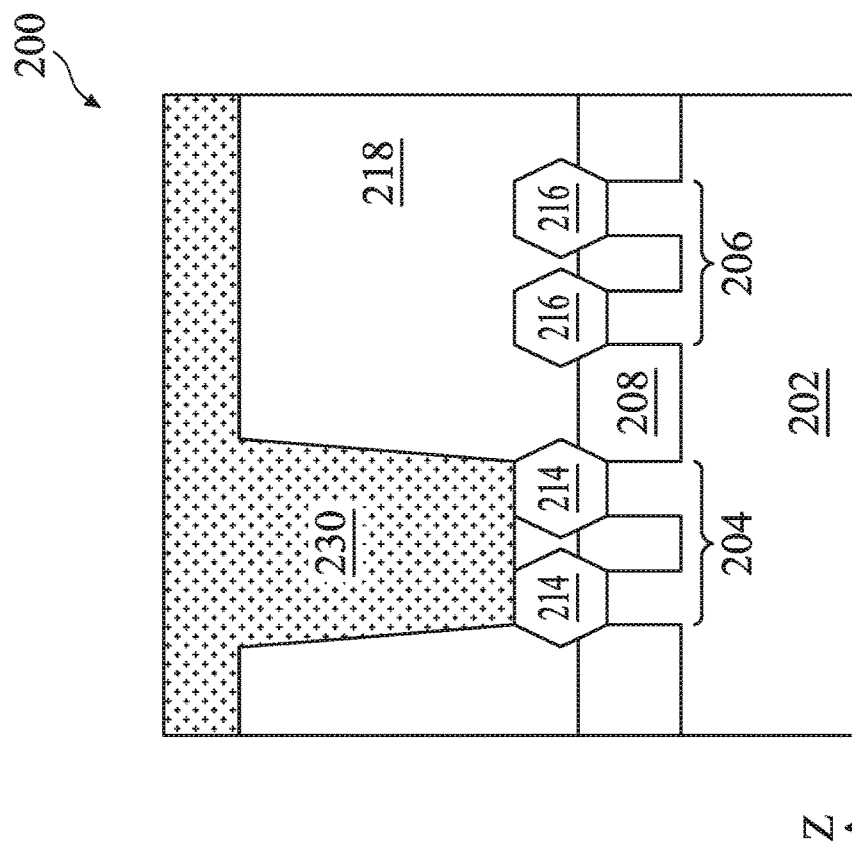
FIG. 6
FIG. 5

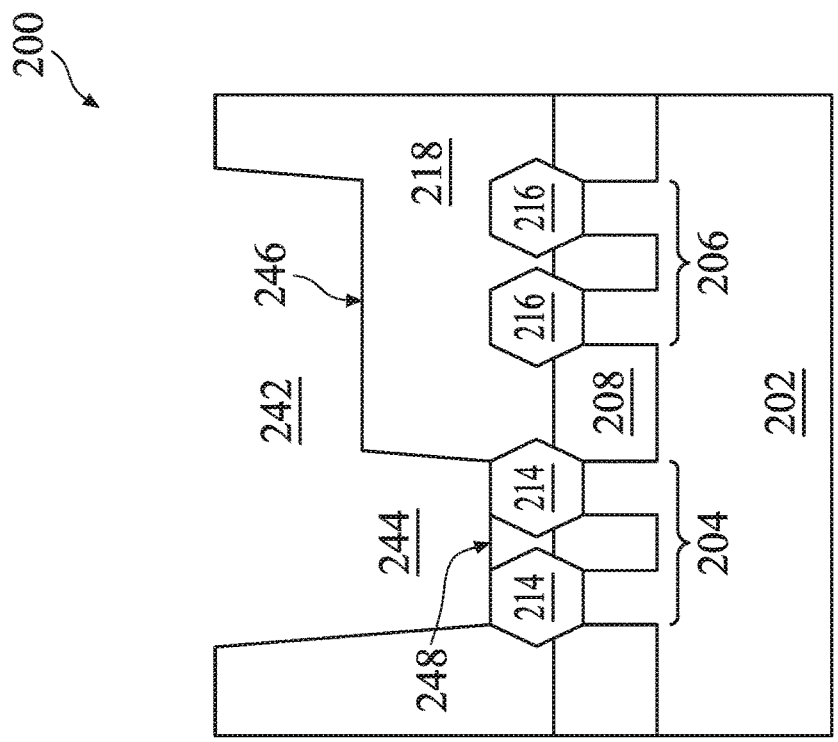
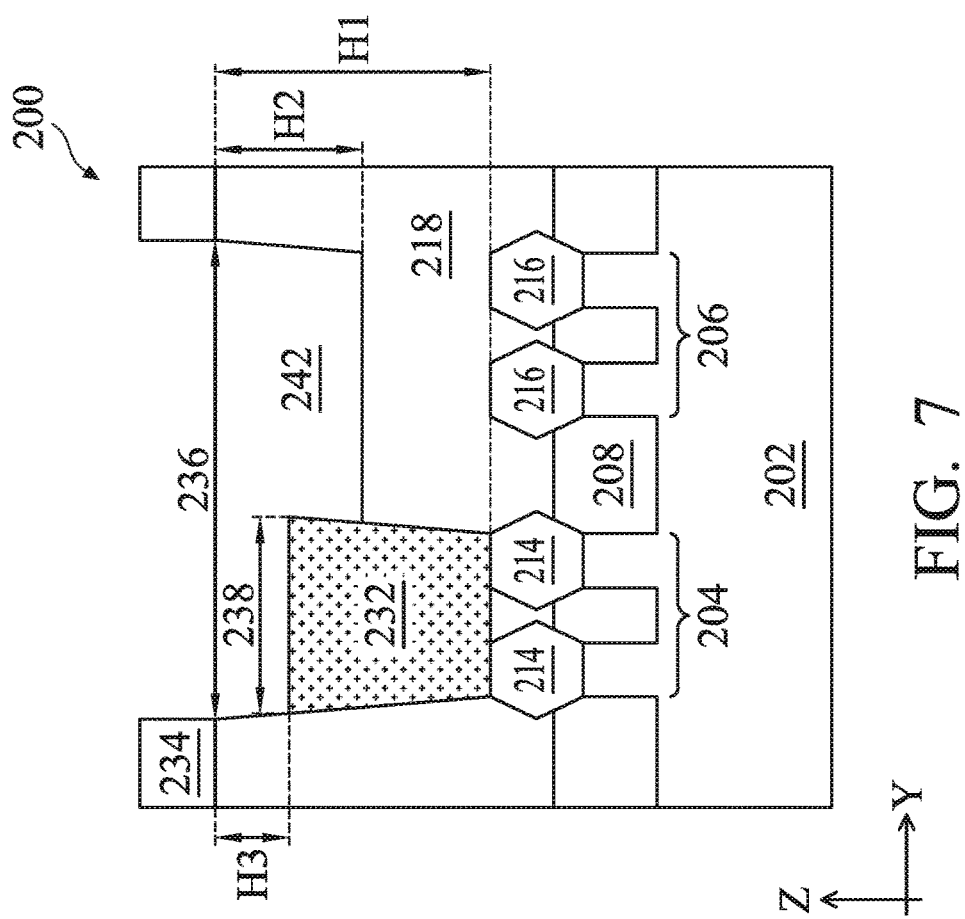
FIG. 7
FIG. 8

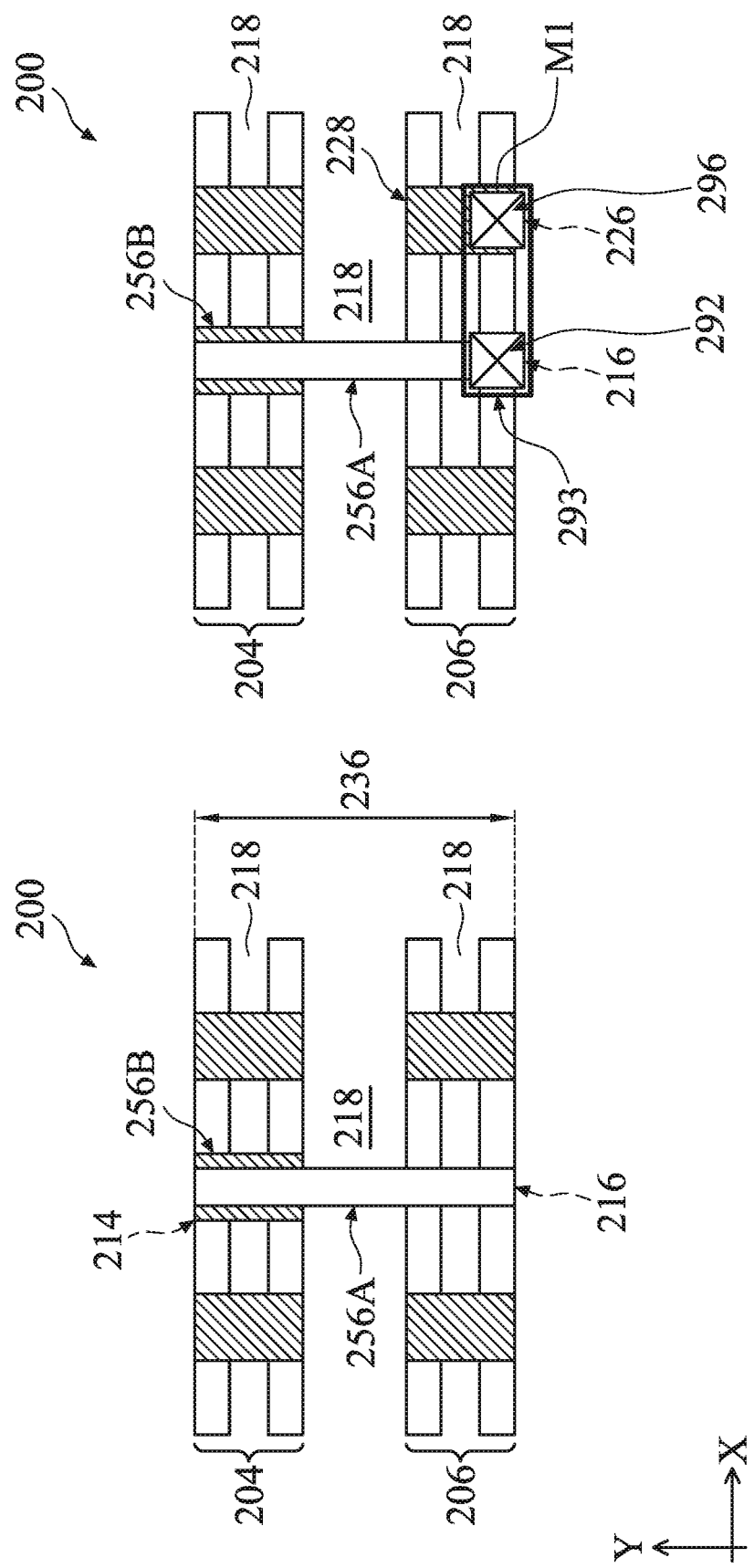

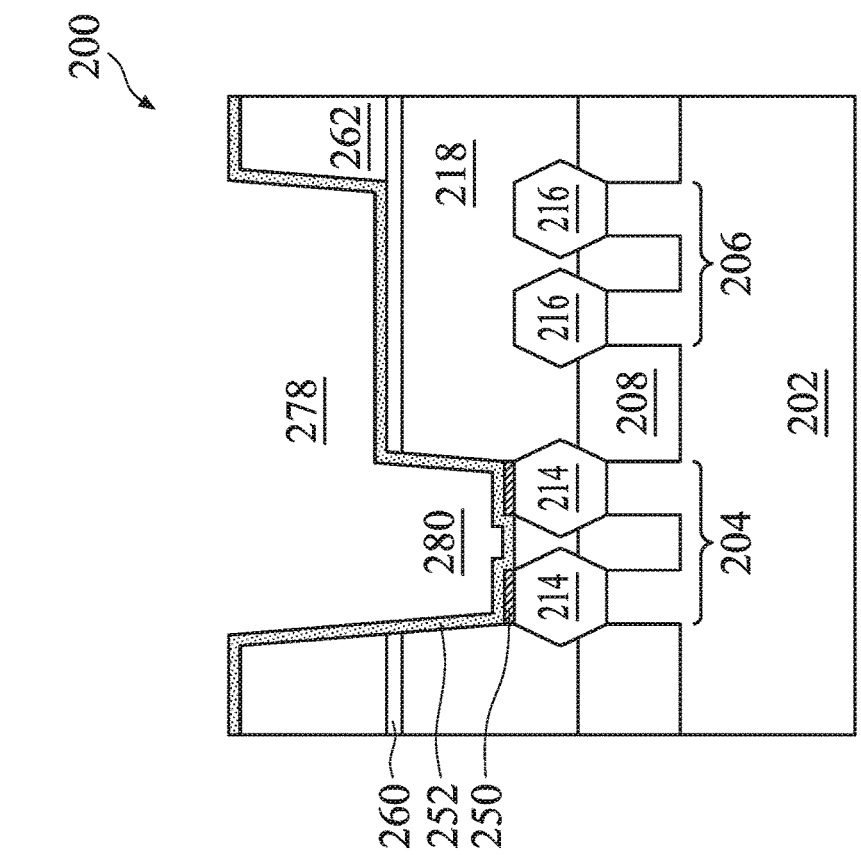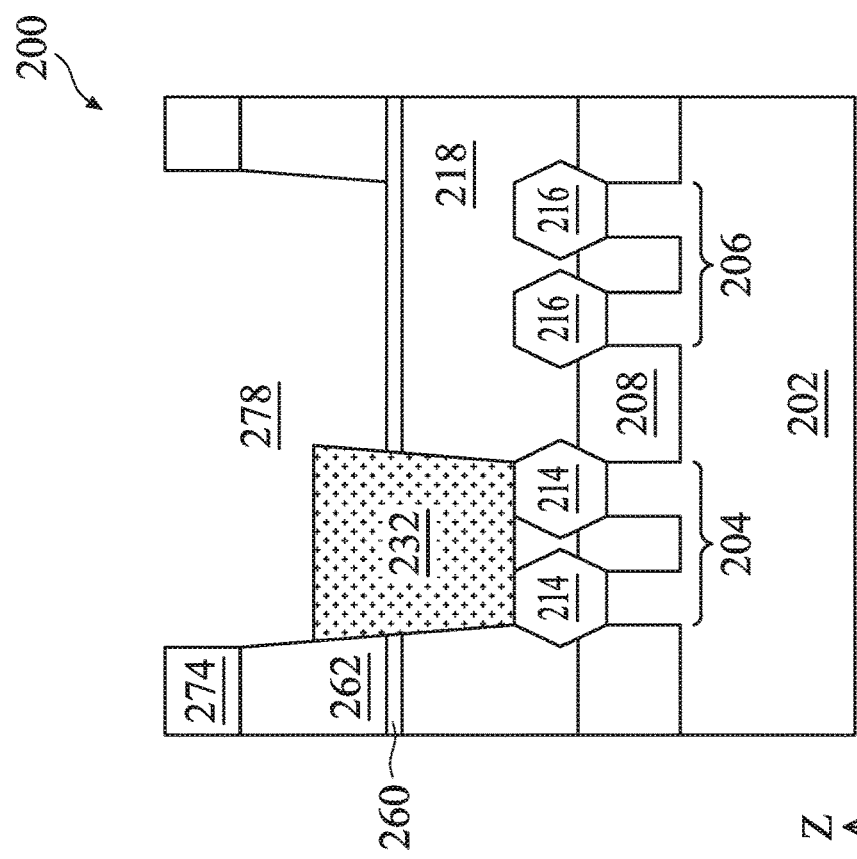
FIG. 19
FIG. 20

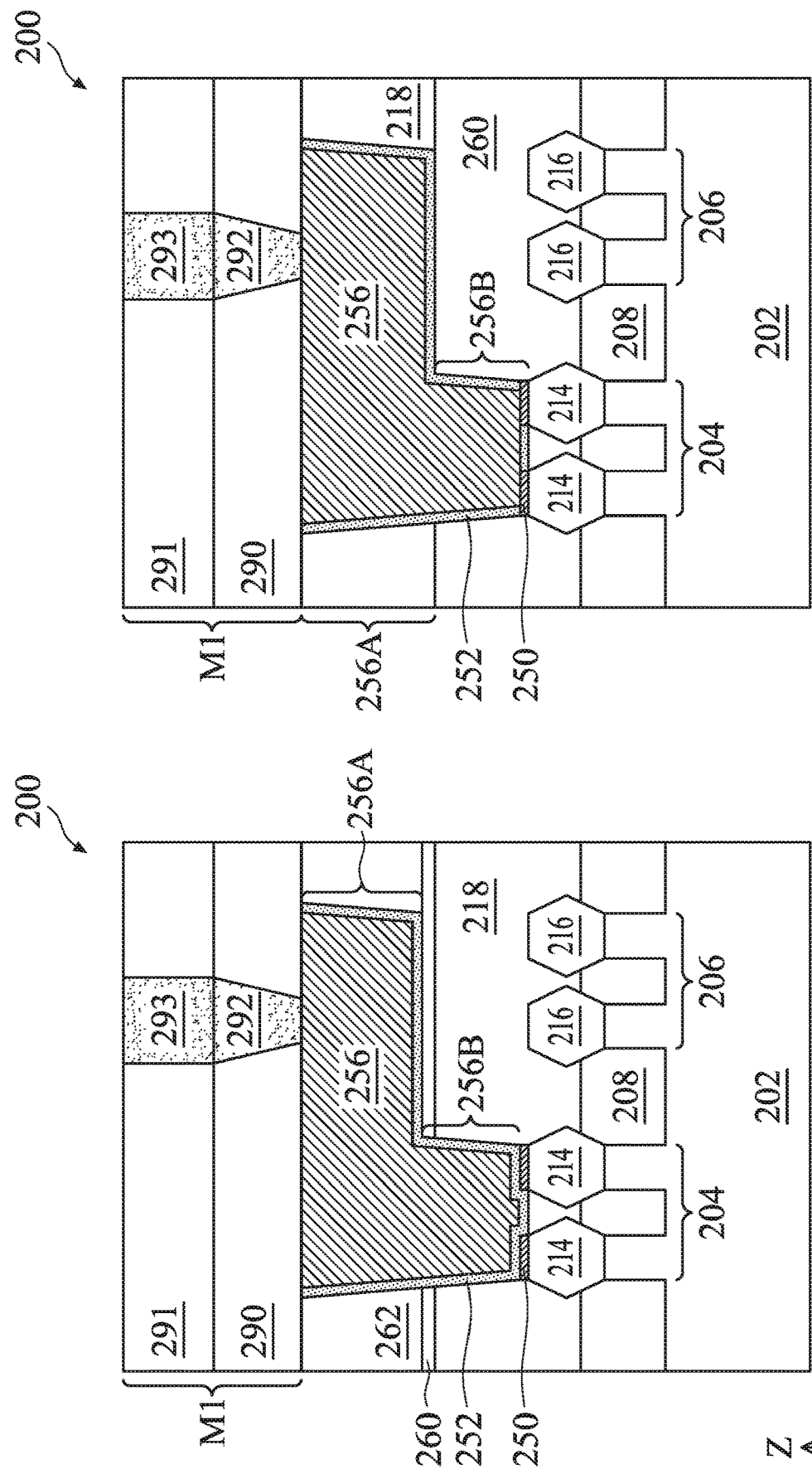

METHODS OF FORMING CONTACT FEATURES IN FIELD-EFFECT TRANSISTORS

CROSS-REFERENCE TO RELATED APPLICATIONS

This is a continuation application of U.S. application Ser. No. 17/391,271, filed Aug. 2, 2021, which is a divisional application of U.S. application Ser. No. 16/393,543, filed Apr. 24, 2019, which further claims priority to U.S. Provisional Application No. 62/691,800, filed Jun. 29, 2018, each of which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, fabrication of source/drain contacts becomes more challenging as feature sizes continue to decrease. At smaller length scales, typical methods of forming source/drain contacts over multiple source/drain features may benefit from improvements in reduced processing complexity and lowered production costs associated with multiple patterning, disposition, and planarization processes.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 13A, and 13B are cross-sectional views of an embodiment of the semiconductor device of FIG. 2 along line AA' during intermediate steps of an embodiment of the method of FIG. 1 according to various aspects of the present disclosure.

FIGS. 12A and 12B are top views of an embodiment of the semiconductor device of FIG. 2 according to various aspects of the present disclosure.

FIGS. 15, 16, 17, 18, 19, 20, 21, 22, 23A, and 23B are cross-sectional views of an embodiment of the semiconductor device of FIG. 2 along line AA' during intermediate steps of an embodiment of the method of FIG. 14 according to various aspects of the present disclosure.

DETAILED DESCRIPTION

Figure 1:
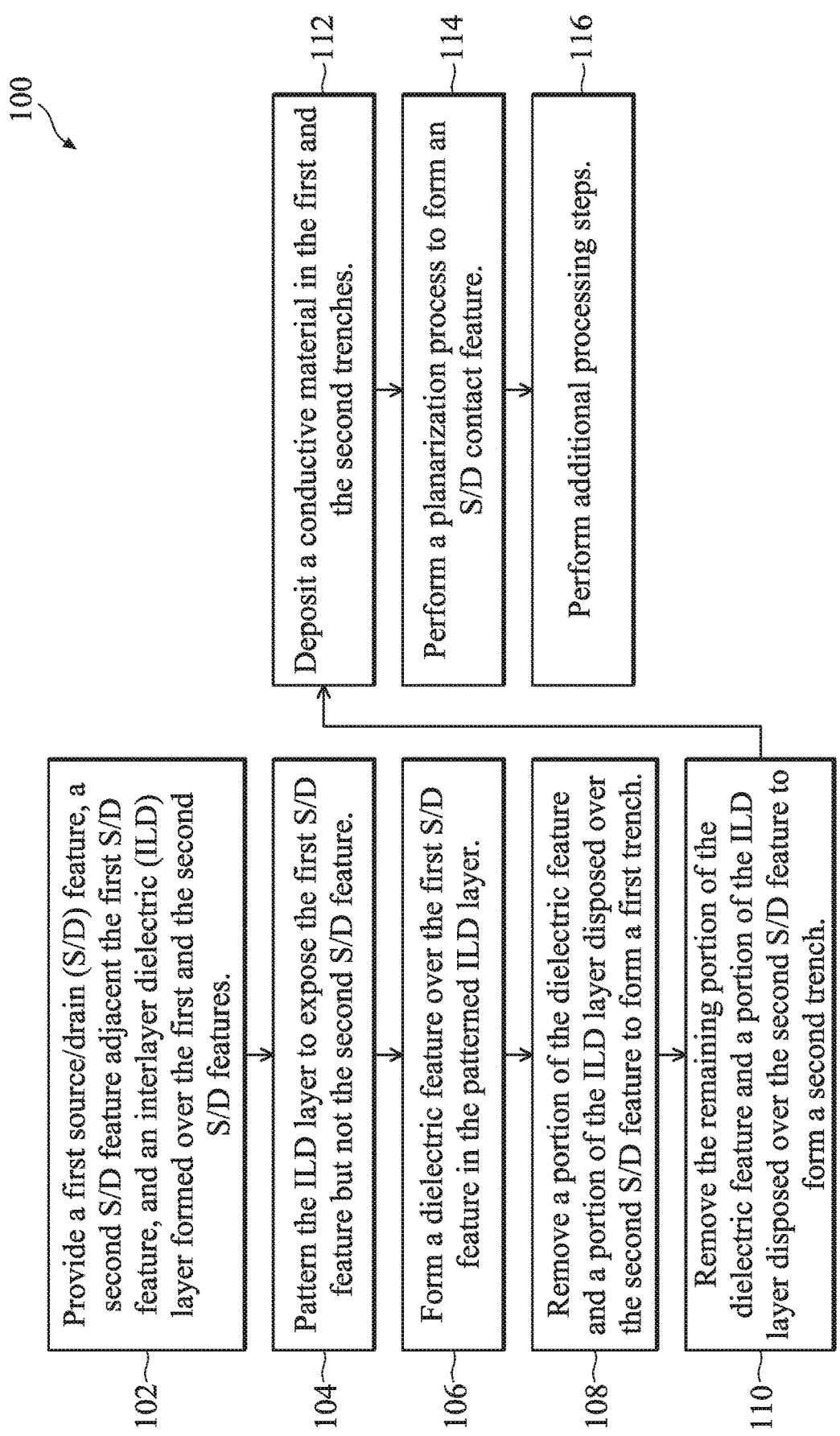
FIG. 1 shows a flow chart of a method of fabricating a semiconductor device according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to field-effect transistors (FETs), such as planar FETs or three-dimensional fin-like FETs (FinFETs). It is an objective of the present disclosure to provide contact features for connecting device-level source/drain features with interconnect features in semiconductor devices.

In FET fabrication, source/drain (S/D) contacts are generally formed to connect device-level S/D features with interconnect features such as vias and conductive lines. A series of patterning processes is typically performed to form a trench (e.g., a contact hole) over each S/D feature, regardless of whether an active (or conductive) S/D contact is eventually desired for a given S/D feature. In instances where only an internal node (i.e., an inactive or insulating S/D contact) rather than a metal S/D contact is needed to meet specific design requirements, a dielectric feature is formed in the trench by a series of deposition and planarization processes as a "dummy S/D contact." While such method has the advantage of reducing process variations observed during the patterning processes, improvements may still be desired for decreased processing complexity and lowered production costs associated with the patterning, deposition, and planarization processes. In addition, it may be desirable to form a conductive flyover feature extending the metal S/D contact laterally (without performing additional patterning and deposition processes) to provide additional routing options in standard cells where the number of routing tracks is reduced due to reduced feature sizes.

Figure 2:
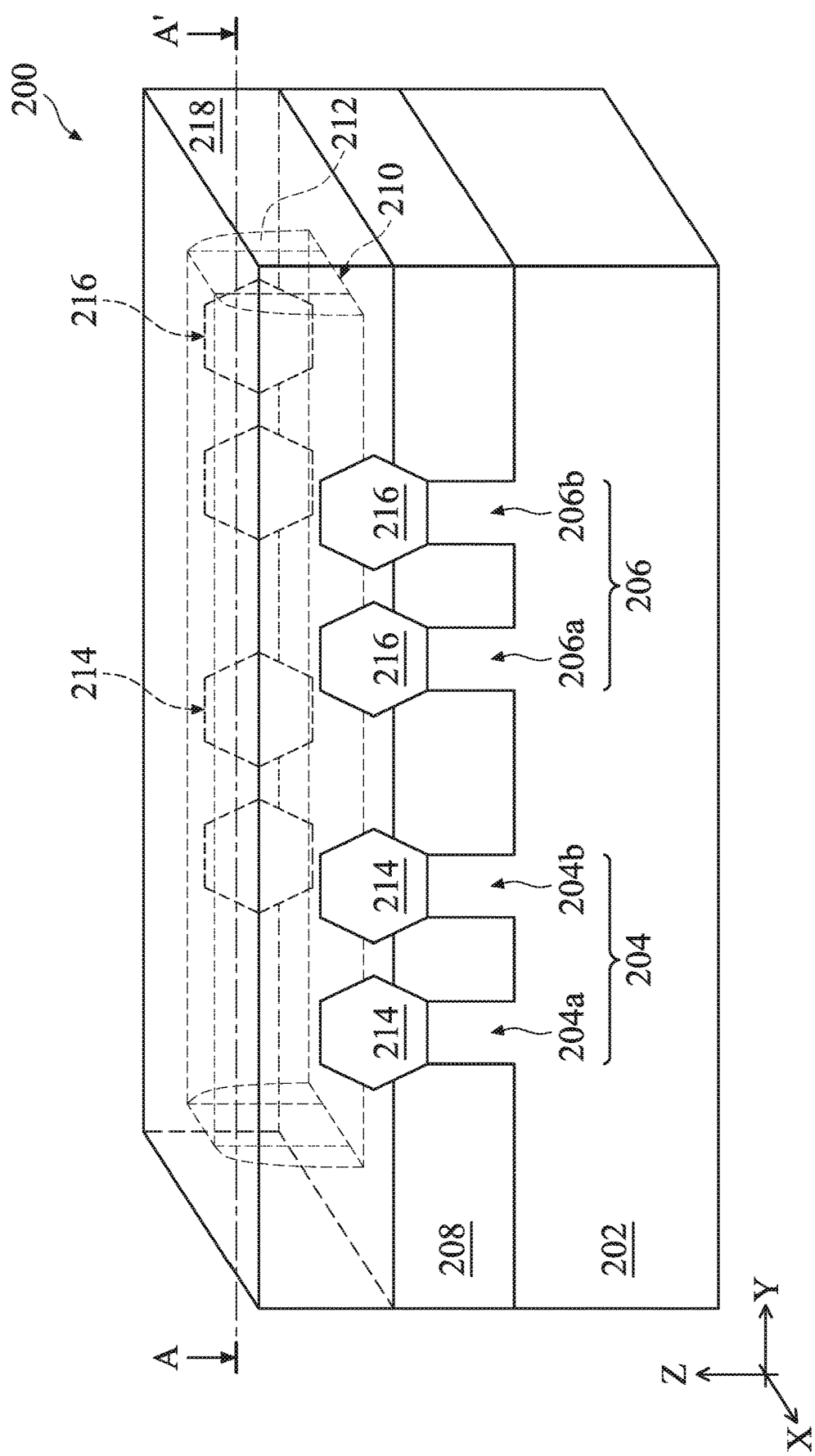
FIG. 2 is a perspective view of an embodiment of a semiconductor device according to various aspects of the present disclosure.
Figures 13A, 13B:
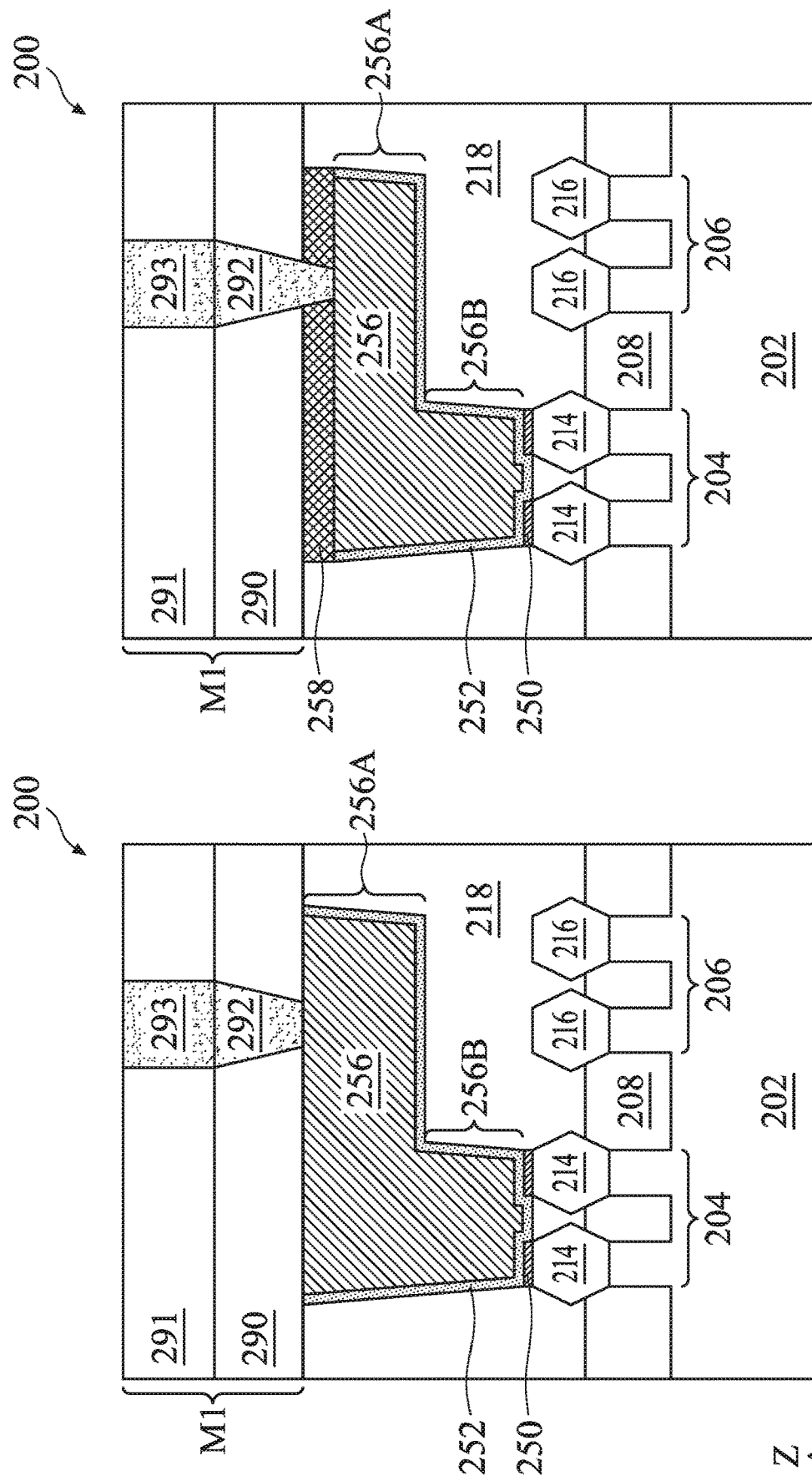
Figure 14:
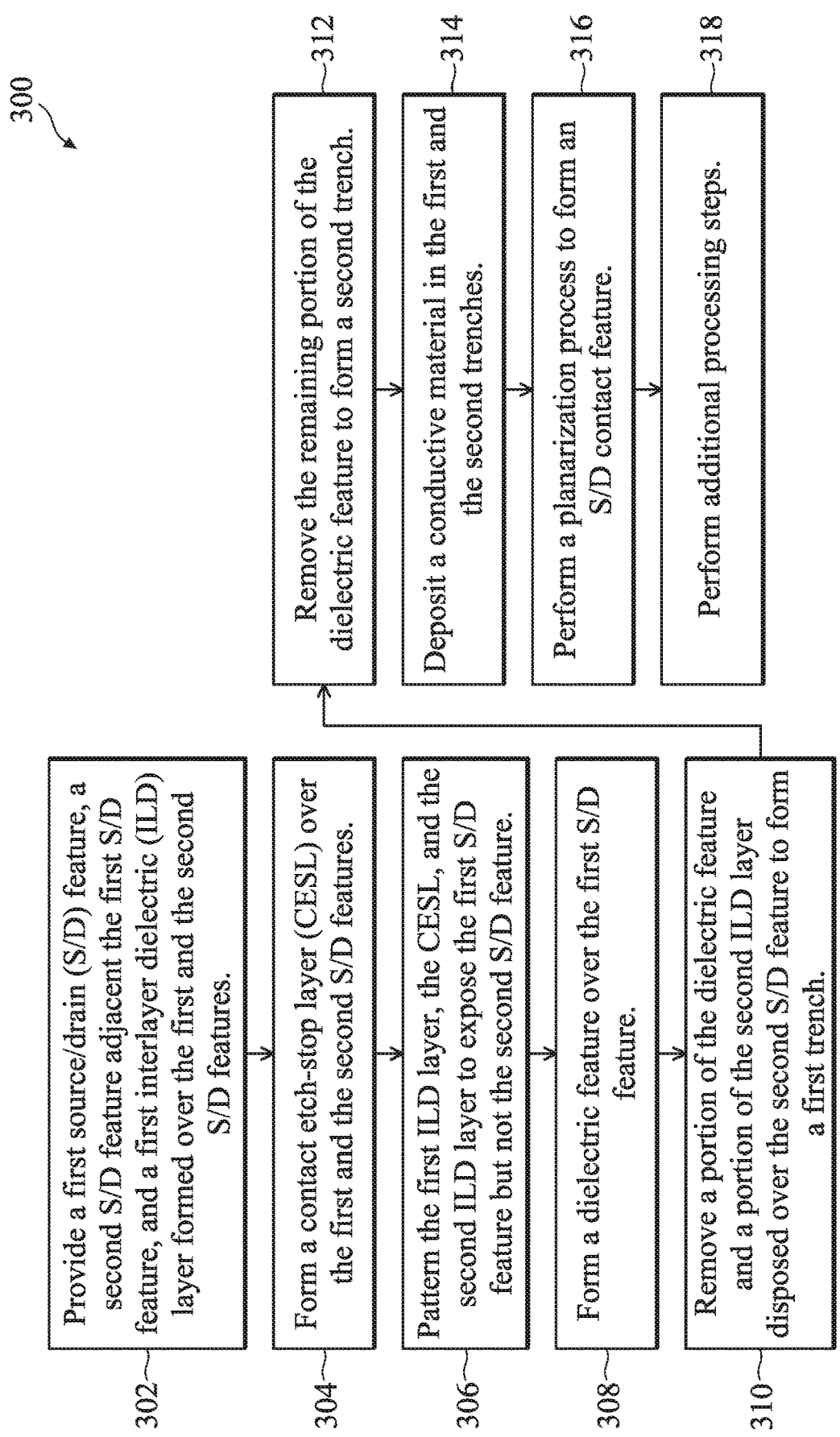
FIG. 14 shows a flow chart of a method of fabricating a semiconductor device according to various aspects of the present disclosure.

FIGS. 1 and 14 illustrate a method 100 and a method 300, respectively, for forming a semiconductor device 200 according to various aspects of the present disclosure. The methods 100 and 300 are merely examples, and are not intended to limit the present disclosure beyond what is explicitly recited in the claims. Additional operations can be provided before, during, and after the methods 100 and 300, and some operations described can be replaced, eliminated, or moved around for additional embodiments of the method. The method 100 is described below in conjunction with FIGS. 2-13B, which illustrate a portion of the semiconductor device 200 during intermediate steps of the method 100. The method 300 is described below in conjunction with FIGS. 2 and 15-23B, which illustrate a portion of the semiconductor device 200 during intermediate steps of the method 300. FIGS. 3-11, 13B, and 15-23B are cross-sectional views of the device 200 taken along dashed line AA' through an S/D region of fins 204a, 204b, 206a, and 206b as illustrated in FIG. 2, while FIGS. 12A and 12B are schematic top views of a portion of the device 200. The device 200 may be an intermediate device fabricated during processing of an IC, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFETs), complementary metal-oxide semiconductor (CMOS) transistors, bipolar transistors, high voltage transistors, high frequency transistors, and/or other memory cells The present disclosure is not limited to any particular number of devices or device regions, or to any particular device configurations. For example, though the device 200 as illustrated is a three-dimensional FinFET device, the present disclosure may also provide embodiments for fabricating planar FET devices.

Figure 3:
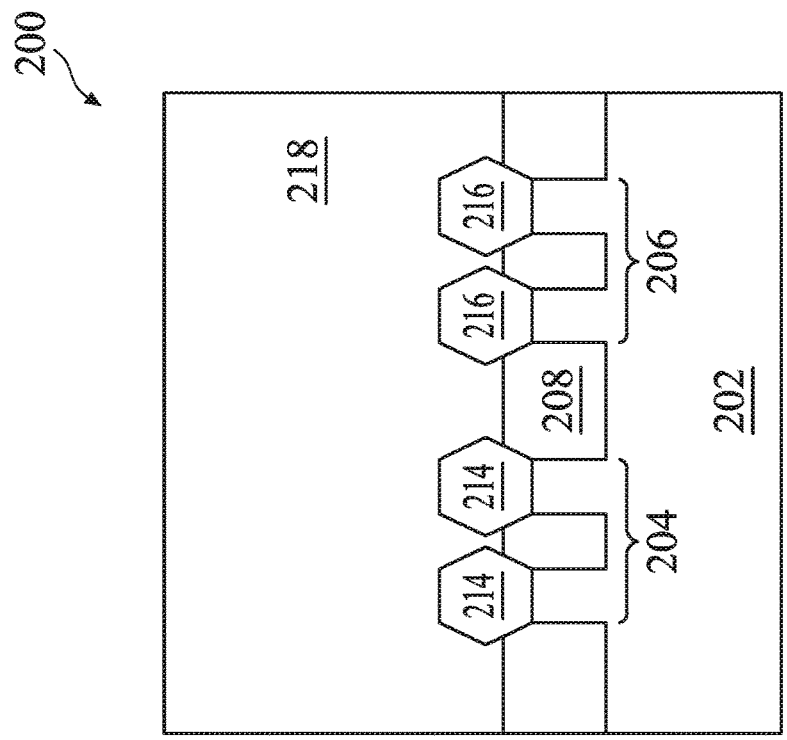

At operation 102, referring to FIGS. 1-3, the method 100 provides a device 200 including a substrate 202 having a first region 204 and a second region 206, where the first region 204 includes two three-dimensional active regions (hereafter referred to as fins) 204a and 204b and the second region 206 includes two fins 206a and 206b. The device 200 further includes a high-k metal gate (HKMG) structure 210 disposed over the first region 204 and the second region 206, gate spacer 212 disposed on sidewalls of the HKMG structure 210, S/D features 214 and 216 disposed over the fins 204a (and 204b) and 206a (and 206b), respectively, isolation structures 208 disposed over the substrate 202 separating various components of the device 200, and an interlayer dielectric (ILD) layer 218 disposed over the isolation structures 208 and the S/D features 214 and 216. Although in the depicted embodiment, each of the first region 204 and the second region 206 includes two fins, the present disclosure is not limited to this configuration. For example, each of the first region 204 and the second region 206 may include one fin or more than two fins. Additionally, the S/D features 214 and 216 may be merged together or separated as depicted.

The substrate 202 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions, such as source/drain regions, are formed in or on the substrate 202. The doped regions may be doped with n-type dopants, such as phosphorus or arsenic, and/or p-type dopants, such as boron, depending on design requirements. The doped regions may be formed directly on the substrate 202, in a p-well structure, in an n-well structure, in a dual-well structure, or using a raised structure. Doped regions may be formed by implantation of dopant atoms, in-situ doped epitaxial growth, and/or other suitable techniques.

Still referring to FIGS. 2-3, the first region 204 may be suitable for forming an n-type FinFET, and the second region 206 may be suitable for forming a p-type FinFET. In alternative embodiments, the first region 204 and the second region 206 may be suitable for forming FinFETs of a similar type, i.e., both n-type or both p-type. This configuration is for illustrative purposes only and is not intended to be limiting. The fins 204a and 204b and the fins 206a and 206b may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204a and 204b and the fins 206a and 206b on the substrate 202. The etching process may include dry etching, wet etching, reactive ion etching (RIE), and/or other suitable processes.

Numerous other embodiments of methods for forming the fins 204a and 204b and the fins 206a and 206b may be suitable. For example, the fins 204a and 204b and the fins 206a and 206b may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204a and 204b and the fins 206a and 206b. The trenches may then be filled with an isolating material described above by a deposition process, followed by a chemical mechanical planarization/polishing (CMP) process. Other isolation structures such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SoG), other suitable methods, or combinations thereof.

Still referring to FIG. 2, the device 200 includes S/D features 214 and 216 disposed over the fins 204a and 204b and the fins 206a and 206b, respectively, each being adjacent to the HKMG structure 210. The S/D features 214 and 216 may be formed by any suitable techniques, such as etching processes followed by one or more epitaxy processes. In one example, one or more etching processes are performed to remove portions of the fins 204a and 204b and the fins 206a and 206b to form recesses (not shown) therein, respectively. A cleaning process may be performed to clean the recesses with a hydrofluoric acid (HF) solution or other suitable solution. Subsequently, one or more epitaxial growth processes are performed to grow epitaxial features in the recesses. Each of the S/D features 214 and 216 may be suitable for a p-type FinFET device (e.g., a p-type epitaxial material) or alternatively, an n-type FinFET device (e.g., an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopant. In at least one embodiment, the S/D features 214 include a p-type epitaxial material, while the S/D features 216 include an n-type epitaxial material; however, the present disclosure is not limited herein.

The device 200 further includes the HKMG structure 210 disposed over a portion the fins 204a, 204b, 206a, and 206b, such that it interposes S/D features 214 and 216. The HKMG structure 210 includes a high-k dielectric layer (i.e., having a dielectric constant greater than that of silicon oxide; not depicted) disposed over the fins 204a and 204b and the fins 206a and 206b and a metal gate electrode (not depicted) disposed over the high-k dielectric layer. The metal gate electrode may further include at least one work function metal layer and a bulk conductive layer disposed thereover. The work function metal layer may be a p-type or an n-type work function metal layer. Exemplary work function materials include TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The bulk conductive layer may include copper (Cu), tungsten (W), aluminum (Al), cobalt (Co), other suitable materials, or combinations thereof. The HKMG structure 210 may further include numerous other layers (not depicted), such as an interfacial layer disposed between the fins 204a and 204b and the fins 206a and 206b and the high-k dielectric layer, hard mask layers, capping layers, barrier layers, other suitable layers, or combinations thereof. Various layers of the HKMG structure 210 may be deposited by any suitable method, such as chemical oxidation, thermal oxidation, atomic layer deposition (ALD), CVD, physical vapor deposition (PVD), plating, other suitable methods, or combinations thereof. A polishing process, such as chemical mechanical polishing (CMP), may be performed to remove excess materials from a top surface of the HKMG structure 210 to planarize a top surface of the device 200.

The device 200 further includes gate spacers 212 disposed on sidewalls of the HKMG structure 210. The gate spacers 212 may include a dielectric material, such as silicon oxide, silicon nitride, silicon carbide, silicon oxynitride, other suitable dielectric materials, or combinations thereof. The gate spacers 212 may be a single layered structure or a multi-layered structure. The gate spacers 212 may be formed by first depositing a blanket of spacer material over the device 200, and then performing an anisotropic etching process to remove portions of the spacer material to form the gate spacers 212 on sidewalls of the dummy gate structure. In some embodiments, the device 200 includes a helmet material layer (not depicted) disposed over the metal gate electrode and the gate spacers 212 to protect the HKMG structure 210 from being unintentionally damaged during a subsequent fabrication process. The helmet material layer may include any suitable dielectric material, such as, for example, silicon carbonitride, aluminum oxide, aluminum oxynitride, zirconium oxide, zirconium nitride, other suitable materials, or combinations thereof.

In many embodiments, the HKMG structure 210 is formed after other components of the device 200 (e.g., the S/D features 214 and 216) are fabricated. Such process is generally referred to as a gate replacement process, which includes forming a dummy gate structure (not depicted) as a placeholder for the HKMG structure 210, forming the S/D features 214 and 216, forming the ILD layer 218 (and optionally a contact etch-stop layer, or CESL) over the dummy gate structure and the S/D features 214 and 216, planarizing the ILD layer 218 by, for example, CMP, to expose a top surface of the dummy gate structure, removing the dummy gate structure in the ILD layer 218 to form a trench that exposes a channel region of the fins 204a and 204b and the fins 206a and 206b, and forming the HKMG structure 210 in the trench to complete the gate replacement process. In some embodiments, the ILD layer 218 includes a dielectric material, such as tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In the depicted embodiment, the ILD layer 218 includes an oxide-containing dielectric material. The ILD layer 218 may include a multi-layer structure having multiple dielectric materials and may be formed by a deposition process such as, for example, CVD, flowable CVD (FCVD), spin-on-glass (SOG), other suitable methods, or combinations thereof. The CESL may comprise silicon nitride, silicon oxynitride, silicon nitride with oxygen or carbon elements, other suitable materials, or combinations thereof, and may be formed by CVD, PVD, ALD, other suitable methods, or combinations thereof.

Figure 4:
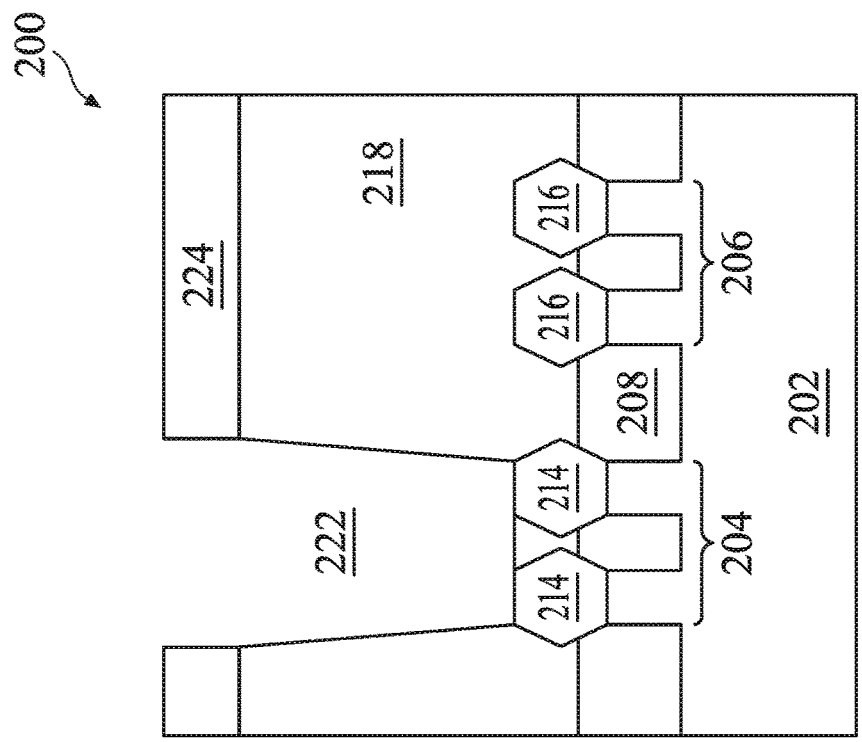

At operation 104, referring to FIG. 4, the method 100 patterns and etches the ILD layer 218 to form a trench 222 over the S/D features 214 but not over the S/D features 216. Specifically, the method 100 forms the trench 222 in the ILD layer 218 by performing a series of patterning and etching processes. In an example embodiment, the series of patterning and etching processes includes forming a masking element 224 over the ILD layer 218 to expose portions of the ILD layer 218 to be etched and subsequently etching the ILD layer 218 in a dry etching, wet etching, reactive ion etching (RIE), other suitable etching processes, or combinations thereof to expose the S/D features 214 in the trench 222. The masking element 224 may include a resist material (e.g., a photoresist material) configured to be patterned by one or more lithography processes. In many embodiments, the etching process is a dry etching process that employs one or more etchants, such as a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, an oxygen-containing gas (e.g., $O_2$), a nitrogen-containing gas (e.g., $N_2$), oxygen, helium, argon, other suitable gases, or combinations thereof. In the depicted embodiment, the dry etching process employs a fluorine-containing etching gas configured to remove portions of the ILD layer 218 exposed by the masking element 224. After performing the etching process, the masking element 224 is removed by any suitable method, such as plasma ashing or resist stripping. Though not depicted herein, the present disclosure may also be directed to embodiments in which the trench 222 is formed over the S/D features 216 but not over the S/D features 214. In other words, the trench 222 is formed over one of two adjacent S/D features (e.g., the S/D features 214 or 216).

Generally, trenches (e.g., the trench 222) configured to provide contact features may first be formed over each S/D feature (e.g., both the S/D features 214 and 216) in a series of patterning etching processes as described above. In other words, masking elements (e.g., the masking element 224) may be patterned to expose each S/D feature, followed by one or more suitable etching processes (e.g., the dry etching process at operation 104). Thereafter, for embodiments in which one or more S/D features do not require an active (i.e., conductive) S/D contact for a subsequent processing step, such as the S/D features 216 in the present disclosure, the trench formed thereover may be filled with a dielectric material, thereby forming a dummy contact feature adjacent the trench(es) configured to form active contact feature(s). Although patterning and etching multiple trenches at once may reduce overall processing variations between the trenches, additional deposition steps are required to fill the trenches with a dielectric material to form any inactive (insulating or dummy) S/D contacts, followed by performing one or more planarization processes such as CMP. In contrast, directly patterning and etching only those trenches that provide active contact features may help reduce processing complexity by eliminating the needs for additional patterning, deposition, and planarization processes to form inactive S/D contacts. Notably, this reduction in processing steps is particularly prevalent in embodiments in which standard cell sizes have been decreased and the number of routing tracks have been reduced as a result.

Referring to FIGS. 5 and 6, the method 100 at operation 106 then fills the trench 222 with a dielectric material 230 (portions of which are also deposited over a top surface of the ILD layer 218) to form a dielectric feature 232. In the depicted embodiment, portions of the dielectric material 230 are also deposited over a top surface of the ILD layer 218. The dielectric material 230 may include any suitable dielectric material, such as, for example, a carbon-containing material (e.g., spin-on carbon (SOC)), an oxygen-containing material (e.g., silicon oxide, SOG, a metal oxide, etc.), a nitrogen-containing material (e.g., silicon nitride, a metal nitride such as TiN, TaN, WN, etc.), a silicon-containing material (e.g., amorphous silicon), other suitable dielectric materials, or combinations thereof. In many embodiments, the dielectric material 230 is different from the dielectric material included in the ILD layer 218, such that when subjected to an etching process, the dielectric material 230 and the ILD layer 218 may be etched at different rates relative to each other, i.e., the etching selectivity between the dielectric material 230 and the ILD layer 218 may be maximized with respect to a given etchant. Referring to FIG. 6, the method 100 planarizes a top surface of the device 200 and removes excess dielectric material 230 disposed on the top surface of the ILD layer 218 by a suitable process such as CMP, thereby forming the dielectric feature 232. The dielectric feature 232, as depicted in FIG. 6, is defined by a height H1, which is measured from a top surface to a bottom surface (i.e., a top surface of the S/D features 214) of the dielectric feature 232.

Referring now to FIG. 7, the method 100 at operation 108 removes a portion of the dielectric feature 232 as well as a portion of the ILD layer 218 disposed over the S/D feature 216 to form a trench 242. In many embodiments, the operation 108 is implemented by a series of patterning and etching processes similar to that discussed above with respect to FIG. 4 at operation 104. In one example, a masking element 234 may be formed over the ILD layer 218 to expose portions of the device 200 to be etched. The masking element 234 includes a resist material (e.g., a photoresist material) configured to be patterned by one or more lithography process. Thereafter, the method 100 performs an etching process to remove portions of the dielectric feature 232 as well as a portion of the ILD layer 218 disposed over the S/D feature 216. The etching process may be a dry etching process, a wet etching process, an RIE process, other suitable processes, or combinations thereof. In many embodiments, the etching process is a dry etching process that employs one or more etchants, such as a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, an oxygen-containing gas (e.g., $O_2$), a nitrogen-containing gas (e.g., $N_2$), oxygen, helium, argon, other suitable gases, or combinations thereof. In the depicted embodiment, similar to the operation 104, the dry etching process employs a fluorine-containing etching gas. Thereafter, the masking element 234 is removed from the device 200 by any suitable method, such as plasma ashing or resist stripping.

In many embodiments, due to the difference in composition between the dielectric material 230 and the ILD layer 218, the trench 242 is defined by H2, which is measured from a top surface of the ILD layer 218 to a top surface of the ILD layer 218 defining a bottom surface of the trench 242 in the second region 206, and by H3, which is measured from the top surface of the ILD layer 218 to a top surface of the dielectric feature 232 in the first region 204. In the depicted embodiment, the dielectric feature 232 is etched at a lower rate than the ILD layer 218, such that a greater amount of the ILD layer 218 than the dielectric feature 232 is removed at operation 108. In other words, the depth H2, reflective of the amount of the ILD layer 218 removed, is greater than the depth H3, reflective of the amount of the dielectric feature 232 removed. However, the present disclosure is not limited to this configuration. For example, the depth H3 may be greater than the depth H2 instead. Regardless of the relative amounts of etching, the dielectric feature 232 is not completely removed from the device 200 at operation 108 and the depth H2 is less in magnitude than the height H1 as described above, ensuring that the etching process performed at the operation 108 does not expose the S/D features 216. Furthermore, controlling the depth H2 ensures that the contact resistance of the subsequently formed S/D contact may be kept within a desired range (e.g., if the depth H2 is too large, the contact resistance of the S/D contact may be too high.) In some examples, the depths H2 and H3 may be tuned by adjusting the etching time applied at operation 108. In further embodiments, a width 236, which measures an opening of the trench 242, is greater than a width 238, which measures a width of the dielectric feature 232 at its top surface after performing the operation 108. The specific magnitude of the width 236 is not limited in the present disclosure so long as it exposes at least a portion of the dielectric feature 232, and may vary depending on specific design requirements.

Referring to FIG. 8, the method 100 at operation 110 selectively removes the remaining portion of the dielectric feature 232 relative to the ILD layer 218 to form a trench 244 that exposes the S/D features 214. Notably, a bottom surface 246 of the trench 242 defined by the ILD layer 218 is disposed above the top surface of the S/D features 214 and 216. In particular, the bottom surface 246 is separated from the top surface of the S/D features 216 by the ILD layer 218, while a bottom surface 248 of the trench 244 is defined by the S/D features 214, and in the depicted embodiment, a portion of the ILD layer 218 disposed between the S/D features 214. The etching process performed at operation 110 may be a dry etching process, a wet etching process, an RIE process, other suitable processes, or combinations thereof. In many embodiments, the dry etching process employs one or more etchants different from that employed for the operations 104 and 108. In the depicted embodiment, the etching process at the operation 110 employs an oxygen-containing etching gas, such as $O_2$, to selectively remove the dielectric material 230 in the dielectric feature 232 relative to the ILD layer 218. Also different from the etching process at operation 108, the etching process at the operation 110 may not employ a masking element for the removal of the dielectric feature 232. Instead, the etching process at the operation 110 is implemented using an etchant configured to etch the dielectric feature 232 at a greater rate than the ILD layer 218, such that the dielectric feature 232 is substantially etched while the ILD layer 218 is not etched or minimally etched. In one example, the etching selectivity of the dielectric feature 232 relative to the ILD layer 218 may be at least 2.

Figure 10:
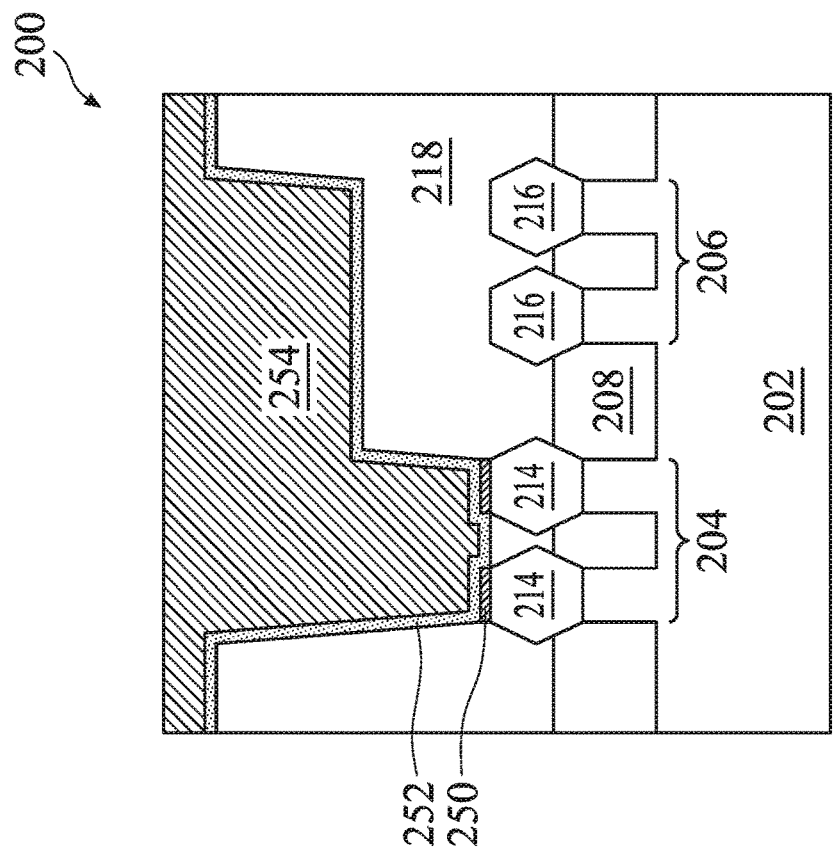
Figure 9:
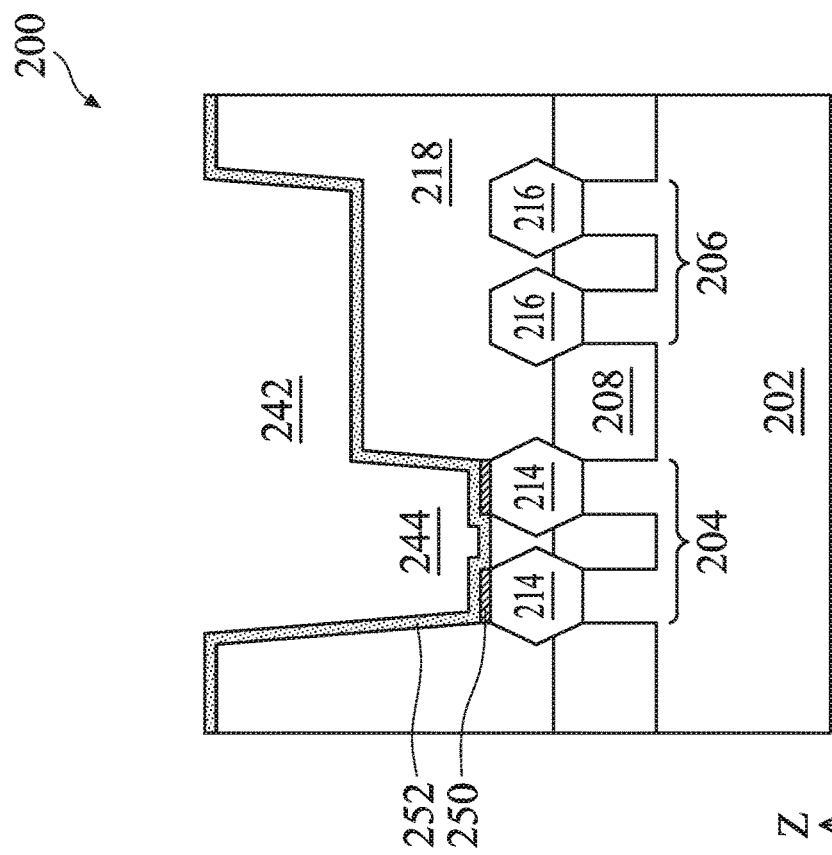
Figure 11:
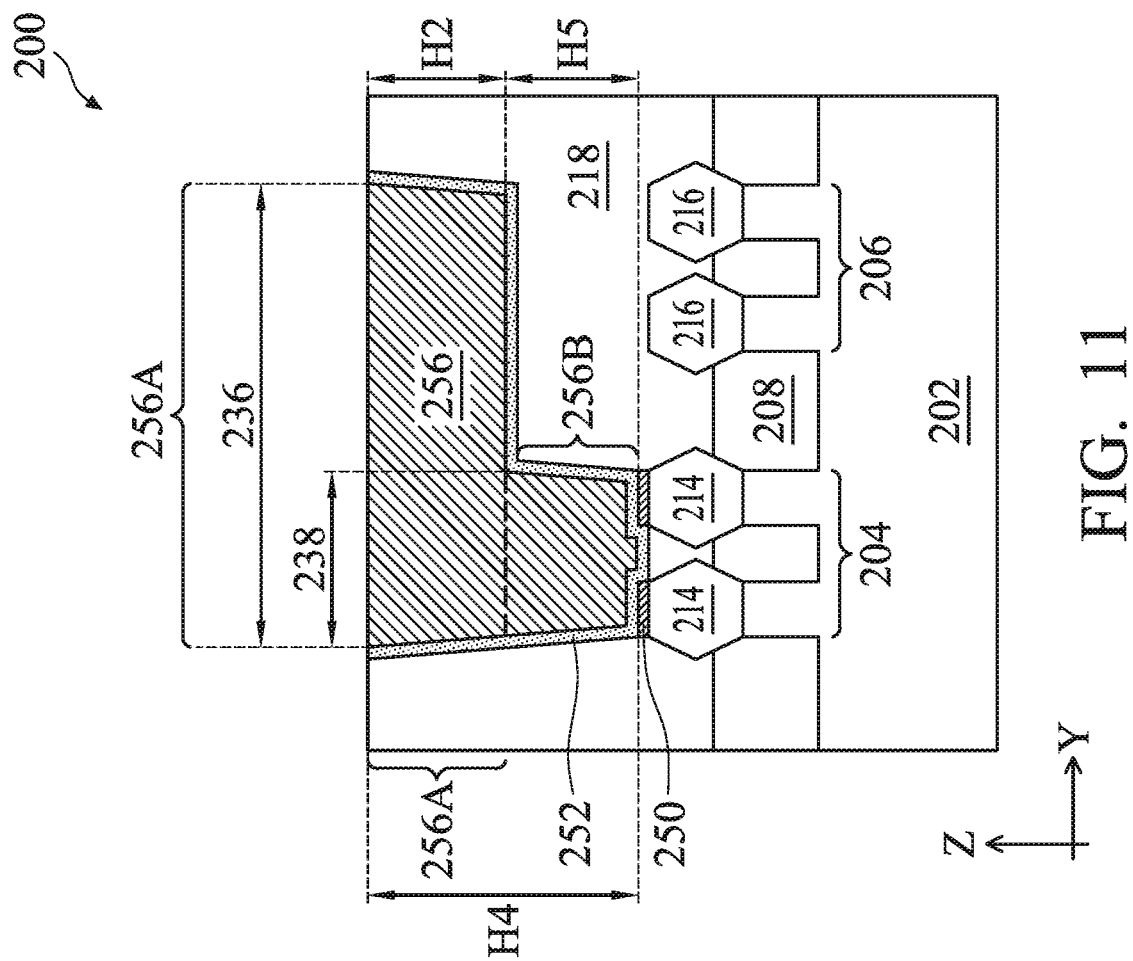

Collectively referring to FIGS. 9-11, the method 100 at operation 112 deposits a conductive material 254 in the trenches 242 and 244. Before filling the trenches 242 and 244 with the conductive material 254, referring to FIG. 9, the method 100 may optionally form a silicide layer 250 over the S/D features 214. In many embodiments, the silicide layer 250 includes nickel silicide, cobalt silicide, tungsten silicide, tantalum silicide, titanium silicide, platinum silicide, erbium silicide, palladium silicide, other suitable silicide, or combinations thereof. The silicide layer 250 may be formed by a deposition process such as CVD, ALD, PVD, other suitable processes, or combinations thereof. For example, a metal layer (e.g., nickel) may be deposited over the S/D features 214. Then, the device 200 is annealed to allow the metal layer and the semiconductor materials of the S/D features 214 to react and form the silicide layer 250. Thereafter, the un-reacted metal layer is removed, leaving the silicide layer 250 over the S/D features 214.

Thereafter, still referring to FIG. 9, the method 100 at operation 112 may conformally form a barrier layer 252 in the trenches 242 and 244, such that the barrier layer 252 defines boundaries of the trenches 242 and 244. In many embodiments, the barrier layer 252 includes a metal nitride, such as TiN, TaN, WN, other suitable nitride materials, or combinations thereof. The barrier layer 252 may be formed by a deposition process such as CVD, ALD, PVD, other suitable processes, or combinations thereof. In some embodiments, the barrier layer 252 may be omitted from the device 200 according to some design requirements. Referring to FIG. 10, the method 100 then deposits the conductive material 254 over the barrier layer 252 in the trenches 242 and 244. The conductive material 254 may include any suitable material, such as W, Co, Ru, Cu, Ta, Ti, Al, Mo, MoW, other suitable conductive materials, or combinations thereof, and may be formed by any suitable method, such as CVD, ALD, PVD, plating, other suitable processes, or combinations thereof. In some embodiments, the barrier layer 252 may include at least one material layer.

Referring to FIG. 11, the method 100 at operation 114 removes excess conductive material 254 formed on the top surface of the ILD layer 218 during a planarization process (e.g., a CMP process) to form an S/D contact 256. In many embodiments, the S/D contact 256 electrically connects the S/D features 214 to additional components of the device 200 formed afterwards, such as, for example, interconnect features (e.g., via contacts, conductive lines, etc.). The S/D contact 256 includes two portions: 256A having the width 236 defined by the opening of the trench 242, and 256B disposed below the portion 256A and having the width 238 and a bottom surface defined by the S/D features 214. Additionally, the portion 256B is defined by a separation distance that is the difference between H1 and H2 as described above. In the present disclosure, the portion 256A may be described as a conductive flyover feature as it is configured to, among other things, extend the portion 256B of the S/D contact 256 in both the X and the Y directions, such that the S/D features 214 may be electrically connected to interconnected features formed afterwards over the S/D contact 256 and to provide additional metal routing options as discussed in detail below.

In order to prevent the portion 256A from contacting the S/D feature 216, a separation distance H5 may be required, which may range from about 5 nm to about 30 nm. H4, which is measured from a bottom surface of the S/D contact 256 to a top surface of the S/D contact 256, ranges from about 10 nm to about 50 nm. Because H4 measures to be about the sum of H2 and H5, controlling H4 would keep both H2 and H5 within a desirable range. In the present disclosure, H5 is controlled to be at least about 5 nm such that an isolation window may be maintained between the S/D contact 256 and the S/D features 216. In other words, if H5 is too small (e.g., less than about 5 nm), the device 200 may suffer from shorted circuitry between the S/D contact 256 and the S/D features 216. On the other hand, if H5 is too large, the contact resistance of the S/D contact 256 may be too large and may pose difficulty for processing due to high aspect ratio. If H2 (as defined previously) is too small, it may be difficult to control height variation of the S/D contact 256 during processing. On the other hand, if H2 is too large, the contact resistance of the S/D contact 256 may be too large and may pose difficulty for processing due to high aspect ratio. Therefore, in some embodiments, a ratio of H5 to H4 ranges from about 0.5 to about 0.6, and a ratio of H2 to H4 ranges from about 0.4 to about 0.5. In some embodiments, the height H5 is greater than the height H2. In some embodiments, the height H5 is approximately the same as the height H2.

FIGS. 12A and 12B are top views of an example layout of device 200 following the implementation of the operation 114. For purposes of simplicity, the S/D features 214 and 216 and the HKMG structure 210 are omitted in FIGS. 12A and 12B. Referring to FIG. 12A, the portion 256A, the conductive flyover feature, of the S/D contact 256 extends from the portion 256B to "fly over" the second region 206 where no contact feature is formed. In other words, one end of the portion 256A physically contacts a conductive feature (i.e., the portion 256B) formed in the first region 204, while the other end of the portion 256A physically contacts a dielectric feature (i.e., the ILD layer 218) disposed in the second region 206. In many embodiments, the portion 256A is defined by the width 236, which is configured to be sufficiently long to fly over the second region 206. In some embodiments, the portion 256A is configured to provide additional routing options when number of routing tracks is decreased due to reduced standard cell sizes when feature sizes decrease. For example, as illustrated in FIG. 12B, the portion 256A provides a routing option for establishing electrical connection between the S/D features 214 (provided in the first region 204) and S/D features 226 (disposed adjacent to the S/D features 216 along the X direction in the second region 206) without requiring additional routing tracks. As depicted herein, an S/D contact 228 is disposed over and in contact with the S/D features 226. It is worth noting that, though not depicted in the cross-sectional views, the S/D features 214 and the S/D features 226 are coupled (electrically and/or physically) by both the portion 256A and a metal layer M1, which is oriented in a non-parallel configuration with respect to the portion 256A. The metal layer M1 may include multiple interconnect features, such as a via 292 disposed over the S/D features 216, a via 296 disposed over the S/D features 226, a metal line 293 that couples the via 292 with the via 296 along the X direction. In the depicted embodiment, the portion 256a and the metal layer M1 are oriented substantially perpendicular with each other, such that the S/D features 214 may be coupled to the S/D features 226 by the portion 256A of the S/D contact 256, the S/D contact 228, and the metal layer M1. In other words, embodiments of the present disclosure provide routing options to couple devices (e.g., S/D features 214 and 226) disposed in different regions and along different directions.

Subsequently, at operation 116, referring to FIGS. 13A-13B, the method 100 performs additional processing steps to the device 200. In one example, referring to FIG. 13A, the method 100 may form vertical interconnect features such as vias and/or horizontal interconnect features such as conductive lines, and multilayer interconnect features such as metal layers and ILD layers can be formed over the device 200. The various interconnect features may implement various conductive materials including Cu, W, Co, Al, Ti, Ta, Pt, Mo, Ag, Au, Mn, Zr, Ru, their respective alloys, metal silicides, and/or other suitable materials. For example, referring to FIG. 13A, the method 100 at operation 116 may form the via 292 in an ILD layer 290 and the metal line 293 in an ILD layer 291, collectively referred to as the metal layer M1 depicted in FIG. 12B, such that the S/D contact 256 couples the via 292 with the S/D feature 214 as discussed above. In some embodiments, the metal layer M1 may include other interconnect features, such as the via 296 as discussed above with reference to FIG. 12B. The vias 292 and 296 may be formed by any suitable method including a series of patterning, deposition, and planarization processes.

Additionally, still referring to FIG. 13B, the method 100 at operation 116 may etch back a portion of the S/D contact 256 to form a trench (not depicted), and subsequently form a dielectric material layer 258 in the trench to accommodate additional processing steps. The dielectric material layer 258 may be first deposited and planarized, such that its top surface is substantially co-planar with the top surface of the ILD layer 218. A vertical interconnect structure, such as the via 292, may then be formed over the S/D contact through the dielectric material layer 258. In some embodiments, the dielectric material layer 258 is configured to provide sufficient etching selectivity (e.g., greater than 10) relative to the helmet material layer formed over the HKMG structure 210 and the gate spacers 212 as discussed above. In other words, a composition of the dielectric material layer 258 formed over the S/D contact 256 is different from a composition of the helmet material and the gate spacers 212 as discussed above. In many embodiments, such etching selectivity ensures that when forming additional interconnect structures (e.g., the via 292) over the S/D contact 256, misalignment during the patterning process does not damage the HKMG structure 210 disposed adjacent the S/D features 214 and 216, which could lead to shorting between the HKMG structure 210 and the interconnect structures. In some embodiments, the dielectric material layer 258 is configured to accommodate a self-aligned contact formation process.

Referring to FIG. 14, the present disclosure further provides a method 300 for fabricating the device 200. The method 300 is described in reference to FIGS. 15-21, which are cross-sectional views of the device 200 taken along the dashed line AA' as shown in FIG. 2. The method 300 is merely an example and is not intended to limit the present disclosure beyond what is explicitly recited in the claims. Additional operations can be provided before, during, and after the method 300, and some operations described can be replaced, eliminated, or moved around for additional embodiments of the method 300. The method 300 is similar, but not identical, to the method 100 in some aspects. Accordingly, for purposes of simplicity, features common to both the methods 100 and 300 are referred to by the same numeric references.

Figure 15:
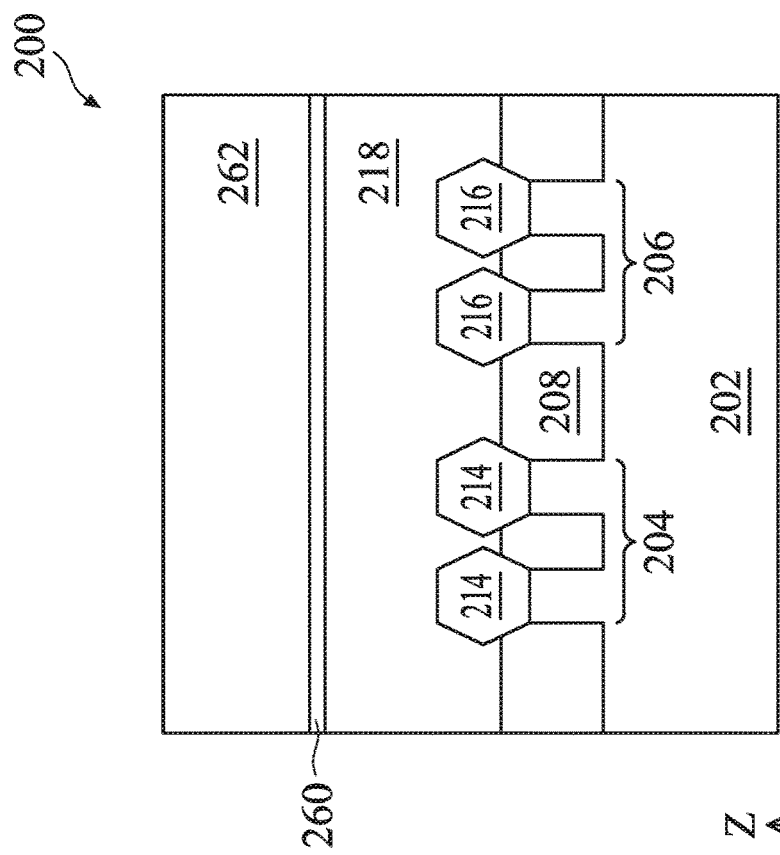

Referring to FIG. 15, the method 300 at operation 302 provides the device 200 as depicted and discussed in reference to FIG. 3. Still referring to FIG. 15, the method 300 at operation 304 forms a contact etch-stop layer (CESL) 260 over the ILD layer 218 and subsequently forms another ILD layer 262 over the CESL 260. Though not depicted, in some embodiments, the CESL 260 may be formed over the S/D features 214 and 216 (e.g., directly deposited over the S/D features 214 and 216) before forming the ILD layer 218 and/or the ILD layer 262. Regardless of method by which the CESL 260 is formed, a top surface of the CESL 260 is disposed above the S/D features 214 and 216, such that it provides a bottom surface for a conductive flyover feature (to be discussed in detail below) similar to the portion 256A as depicted and discussed in FIGS. 11-13B. The CESL 260 may include silicon nitride, silicon oxynitride, silicon oxide, silicon nitride with oxygen and/or carbon elements, aluminum oxynitride, other suitable materials, or combinations thereof and may be formed by CVD, PVD, ALD, other suitable methods, or combinations thereof. The ILD layer 262 may include TEOS, un-doped silicate glass, or doped silicon oxide such as BPSG, FSG, PSG, BSG, other suitable dielectric materials, or combinations thereof. The ILD layer 262 may be similar to the ILD layer 218 and may include a multi-layer structure having multiple dielectric materials and may be formed by a deposition process such as, for example, CVD, PVD, ALD, FCVD, SOG, other suitable methods, or combinations thereof. In some embodiments, the dielectric materials included in the ILD layers 218 and 262 differ from that included in the CESL 260.

Figure 16:
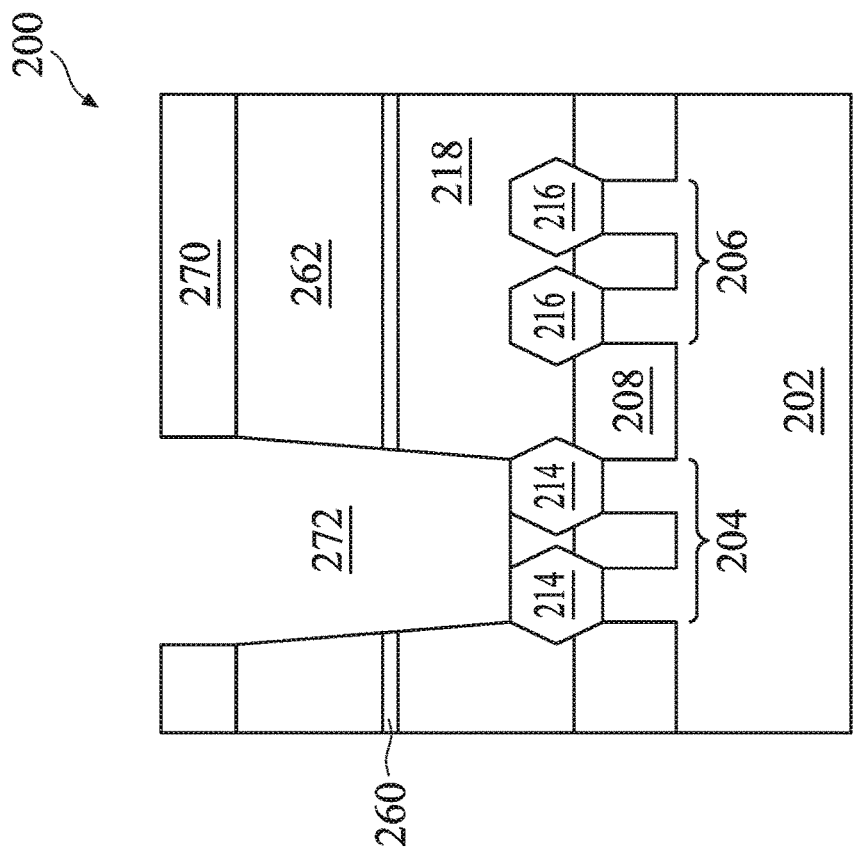

Referring to FIG. 16, the method 300 at operation 306 removes a portion of the ILD layer 262, the CESL 260, and the ILD layer 218 to form a trench 272, thereby exposing the S/D features 214 but not the S/D features 216. In some embodiments, the forming of the trench 272 is implemented in a series of patterning and etching processes similar to that discussed above with respect to operation 104 of the method 100. For example, a masking element 270 similar to the masking elements 224 and 240 is formed over the ILD layer 262 to facilitate the patterning and the etching processes. In some embodiments, because the ILD layer 262 and the CESL 260 include different dielectric materials, more than one etching process (e.g., utilizing different etchants) may be implemented to form the trench 272. Similar to the discussion above with respect to the operation 104, the present disclosure may also be directed to embodiments in which the trench 272 is formed over the S/D features 216 but not over the S/D features 214. In other words, the trench 272 is formed over one of two adjacent S/D features (e.g., the S/D features 214 or 216). Thereafter, the masking element 270 is then removed from the device 200 by any suitable method such as plasma ashing or resist stripping.

Figure 17:
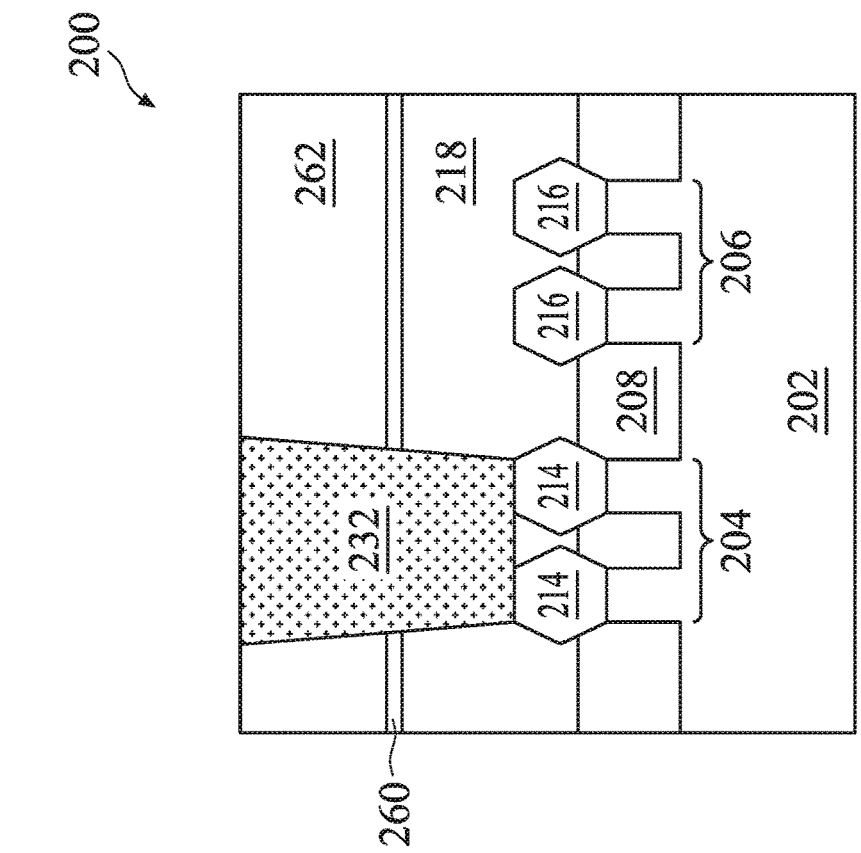
Figure 18:
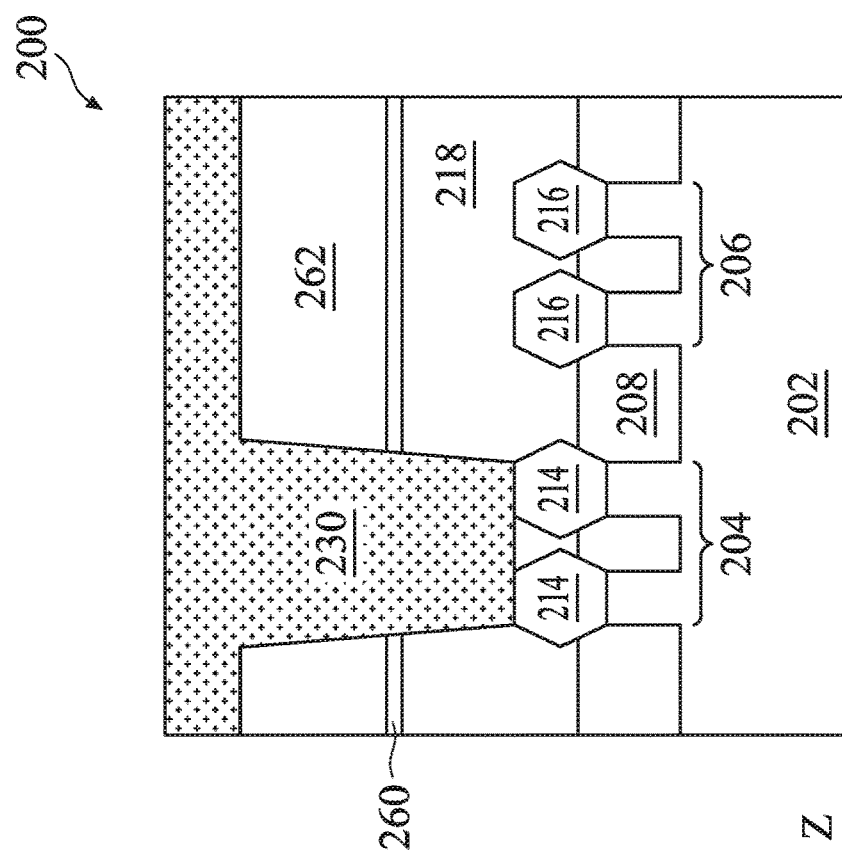

Collectively referring to FIGS. 17 and 18, the method 300 at operation 308 fills the trench 272 with the dielectric material 230 to form the dielectric feature 232 in a process similar to that discussed above with reference to the operation 106 and FIGS. 5 and 6. In many embodiments, the dielectric material 230 differs from the dielectric materials included in the ILD layer 218, the ILD layer 262, and the CESL 260.

Referring to FIG. 19, the method 300 at operation 310 removes a portion of the dielectric feature 232 as well as a portion of the ILD layer 262 disposed over the CESL 260 to form a trench 278. In many embodiments, the operation 310 is implemented by a series of patterning and etching processes similar to that discussed above with respect to FIG. 7 at operation 108. In one example, a masking element 274 similar to the masking elements 224 and 240 may be formed over the ILD layer 262 to expose portions of the device 200 to be etched. The etching process may be a dry etching process, a wet etching process, an RIE process, other suitable processes, or combinations thereof. In the depicted embodiment, similar to the operation 108, a dry etching process employing a fluorine-containing etching gas is implemented. Because the dielectric material included in the CESL 260 differs from that of the ILD layer 262 and of the dielectric feature 232, the etchant employed at operation 310 removes the ILD layer 262, the dielectric feature 232, and the CESL 260 at different rates. In the depicted embodiment, the ILD layer 262 is etched at a higher rate than the dielectric feature 232 and the CESL 260. In fact, the etching process at operation 310 stops at the CESL 260, such that the CESL 260 defines the lowest portion of a bottom surface of the trench 278. In other words, both the ILD layer 262 and the dielectric feature 232 are etched while the CESL 260 is not etched or minimally etched. Thereafter, the masking element 274 is removed from the device 200 by any suitable method, such as plasma ashing or resist stripping.

Figures 21, 22:
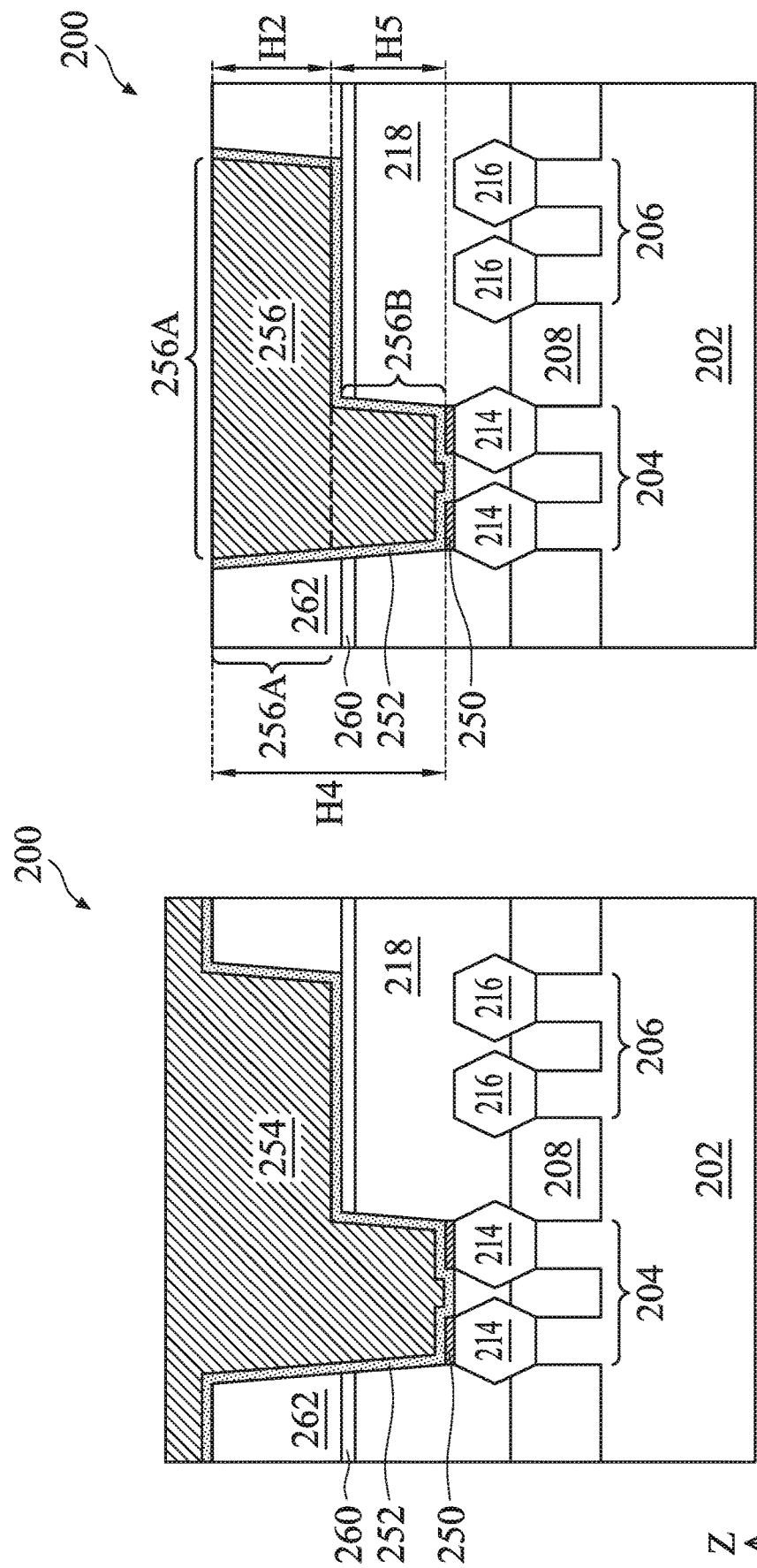

Referring to FIGS. 20-23B, the method 300 at operations 312-318 implements a series of processes similar to the operations 110-116 of the method 100, respectively. For example, at operation 312, referring to FIG. 20, the method 300 removes a remaining portion of the dielectric feature 232 to form a trench 280. Thereafter, the method 300 forms the silicide layer 250 over the S/D features 214. Subsequently, the method 300 conformally forms the barrier layer 252 in the trenches 278 and 280. Thereafter, referring to FIG. 21, the method 300 at operation 314 deposits the conductive material 254 in the trenches 278 and 280 over the barrier layer 252. Referring to FIG. 22, the method 300 at operation 316 removes excess conductive material 254 disposed over a top surface of the ILD layer 262 to form the S/D contact 256. Similar to that depicted in FIGS. 11-13B, the S/D contact 256 includes the portion 256A configured to be the conductive flyover feature connecting the S/D features 214 to additionally formed interconnect features (e.g., the vias 292 and 296 and the metal line 293 as depicted in FIG. 12B).

In some embodiments, referring to FIG. 22, the ratio of H5 to H4 as defined previously with respect to FIG. 11 ranges from about 0.5 to about 0.6, and the ratio of H2 to H4 ranges from about 0.4 to about 0.5. In some embodiments, H5 is greater than H2. In some embodiments, H5 is approximately the same as H2. The method 300 at operation 318 may perform additional processing steps to the device 200. For example, referring to FIG. 23A, the method 300 may form vertical and/or horizontal interconnect features, such as the metal layer M1 including the vias 292 and 296 and the metal line 293 over the device 200 as discussed above with reference to FIG. 13A. In alternative embodiments, referring to FIG. 23B, the S/D features 214 and 216 may be fully embedded in the CESL 260, such that the portion 256A is formed in both the CESL 260 and the ILD layer 218 instead of the ILD layer 262, the CESL 260, and the ILD layer 218 as depicted in FIG. 23A.

Although not intended to be limiting, one or more embodiments of the present disclosure provide many benefits to a semiconductor device and the formation thereof. For example, embodiments of the present disclosure provide methods for forming S/D contact having a conductive flyover (i.e., laterally extended) feature. According to some embodiments of the present disclosure, the S/D contact may be formed by directly patterning an ILD layer disposed over a first S/D feature to form a trench, where the trench laterally extends to above a second S/D feature disposed adjacent the first S/D feature, and subsequently depositing a conductive material in the trench such that the S/D contact electrically connects only the first S/D feature and not the second S/D feature to a subsequently formed interconnect structure (e.g., a via). In many embodiments, the method provided herein reduces the processing complexity and cost associated with the formation of S/D contacts by not patterning those internal (i.e., inactive or insulating) nodes over select S/D features. Moreover, the method provided herein enables the conductive flyover feature to be formed without requiring additional patterning and deposition processes, further reducing the complexity and costs associated with the fabrication of S/D contacts in semiconductor fabrication.

In one aspect, the present disclosure provides a method that includes forming an ILD layer over a first epitaxial S/D feature and a second epitaxial S/D feature disposed adjacent to the second epitaxial S/D feature, forming a dummy contact feature in the ILD layer over the first epitaxial S/D feature, removing a portion of the dummy contact feature and a portion of the ILD layer disposed above the second epitaxial S/D feature to form a first trench, removing a remaining portion of the dummy contact feature to form a second trench, and forming a metal S/D contact in the first and the second trenches.

In another aspect, the present disclosure provides a method that includes etching an ILD layer to form a first trench exposing a first S/D feature over a first fin, where the first S/D feature is disposed adjacent a second S/D feature over a second fin, depositing a dielectric material in the first trench to form a dielectric feature, and replacing the dielectric feature with a conductive feature, wherein the conductive feature directly contacts the first S/D feature and extends over the second S/D feature. In some embodiments, the replacing further includes removing a portion of the dielectric feature and a portion of the ILD layer disposed over the second S/D feature to form a second trench, where a width of the second trench spans a width of the dielectric feature and over a portion of the second S/D feature, removing a remaining portion of the dielectric feature to form a third trench that exposes the first S/D feature, and forming the conductive feature in the second and the third trench.

In yet another aspect, the present disclosure provides a semiconductor structure that includes a first epitaxial S/D feature, a second epitaxial S/D feature disposed adjacent to the first epitaxial S/D feature along a first direction, a third epitaxial S/D features disposed adjacent to the second epitaxial S/D feature along a second direction different from the first direction, an ILD layer disposed over the first, the second, and the third epitaxial S/D features, a first S/D contact disposed over and contacting the first epitaxial S/D feature, where a portion of the first S/D contact laterally extends over the second epitaxial S/D feature and is separated from the second epitaxial S/D feature by the ILD layer, a second S/D contact disposed over and contacting the third epitaxial S/D feature, and a metal layer disposed over the second S/D contact, wherein the metal layer is configured to couple the first S/D contact with the second S/D contact.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first semiconductor fin and a second semiconductor fin adjacent to the first semiconductor fin, wherein the first and the second semiconductor fins extend lengthwise along a first direction over a substrate, and the first and the second semiconductor fins are spaced away from each other in a second direction perpendicular to the first direction;
    a metal gate structure over the first semiconductor fin and the second semiconductor fin, the metal gate structure extending lengthwise along the second direction;
    a first epitaxial source/drain (S/D) feature disposed over the first semiconductor fin;
    a second epitaxial S/D feature disposed over the second semiconductor fin;
    an interlayer dielectric (ILD) layer disposed over the first and the second epitaxial S/D features; and
    an S/D contact disposed directly above the first and second epitaxial S/D features, wherein the S/D contact directly contacts the first epitaxial S/D feature, and the S/D contact is isolated from the second epitaxial S/D feature by the ILD layer.

2. The semiconductor structure of claim 1, wherein the S/D contact has a first portion and a second portion, the first portion penetrates deeper into the ILD layer than the second portion, and the first portion directly lands on the first epitaxial S/D feature while the second portion directly lands on the ILD layer without landing on the second epitaxial S/D feature.

3. The semiconductor structure of claim 2, wherein the first portion has a first height, the second portion has a second height smaller than the first height, and a difference between the first height and the second height is a third height, wherein the third height is defined by a separation distance between the second portion and the second epitaxial S/D feature.

4. The semiconductor structure of claim 3, wherein the third height is greater than the second height.

5. The semiconductor structure of claim 3, wherein a ratio of the third height to the first height ranges from about 0.5 to about 0.6.

6. The semiconductor structure of claim 3, wherein the S/D contact includes a fill metal of a first metal-containing conductive material and a conductive barrier layer of a second metal-containing conductive materials surrounding the fill metal, the conductive barrier layer continuously spans an outer perimeter of the metal fill, and the conductive barrier layer is in direct contact with the ILD layer, and wherein the first metal-containing and second metal-containing conductive materials are different in composition.

7. The semiconductor structure of claim 3, wherein the first height ranges from about 10 nm to about 50 nm, and the third height ranges from about 5 nm to about 40 nm.

8. The semiconductor structure of claim 2, wherein the second portion has a greater width along the second direction than the first portion.

9. The semiconductor structure of claim 1, wherein the S/D contact is a first S/D contact, and the semiconductor structure further comprises:
    a third epitaxial S/D feature disposed over another portion of the second semiconductor fin;
    a second S/D contact disposed over and in direct contact with the third epitaxial S/D feature; and
    a metal line disposed over the first S/D contact and the second S/D contact, the metal line oriented lengthwise along the first direction and electrically connecting the first S/D contact to the second S/D contact.

10. A semiconductor structure, comprising:
    a first epitaxial source/drain (S/D) feature over a first fin, the first fin extends lengthwise along a first direction;
    a second epitaxial S/D feature over a second fin, the second fin extends lengthwise along the first direction;
    a metal gate structure extending over the first and second fins along a second direction perpendicular to the first direction, wherein the first and the second epitaxial S/D features are disposed adjacent the metal gate structure on a same side of the metal gate structure;
    an interlayer dielectric (ILD) layer disposed over the first and the second epitaxial S/D features; and
    an S/D contact disposed over the first and the second epitaxial S/D features,
    wherein the S/D contact includes a first portion having a first height, a second portion having a second height, and the second portion is extended away from the first portion along the second direction,
    wherein the first portion lands on the first epitaxial S/D feature, and the second portion is separated from the second epitaxial S/D feature by an isolating portion of the ILD layer.

11. The semiconductor structure of claim 10, further comprising:
- a via disposed over and landing on the second portion of the S/D contact; and
- a metal line disposed over and landing on the via.

12. The semiconductor structure of claim 10, wherein the S/D contact includes a fill metal of a first metal-containing conductive material and a conductive barrier layer of a second metal-containing conductive materials surrounding the fill metal, the first metal-containing and second metal-containing conductive materials are different in composition, and the fill metal spans vertically for an entirety of the first height.

13. The semiconductor structure of claim 10, wherein a top surface of the first epitaxial S/D feature includes a silicide layer, and the silicide layer directly contacts the S/D contact.

14. The semiconductor structure of claim 10, further comprising:
- a contact etch stop layer (CESL) embedded in the ILD layer, wherein the first portion of the S/D contact penetrates through the CESL layer to land on the first epitaxial S/D feature, and the second portion of the S/D contact lands on a top surface of the CESL.

15. The semiconductor structure of claim 14, wherein the ILD layer and the CESL include different dielectric materials.

16. The semiconductor structure of claim 10, wherein a ratio of the second height to the first height is about 0.4 to about 0.5.

17. A semiconductor structure, comprising:
- a first semiconductor fin and a second semiconductor fin adjacent to the first semiconductor fin, wherein the first and the second semiconductor fins extend lengthwise along a first direction over a substrate;
- a metal gate structure over the first semiconductor fin and the second semiconductor fin, the metal gate structure extending lengthwise along a second direction perpendicular to the first direction;
- a first epitaxial source/drain (S/D) feature disposed over the first semiconductor fin;
- a second epitaxial S/D feature disposed over the second semiconductor fin;
- a first interlayer dielectric (ILD) layer disposed over the first and the second epitaxial S/D features;
- a contact etch stop layer (CESL) disposed over the ILD layer;
- a second ILD layer disposed over the CESL; and
- an S/D contact having a deep portion disposed directly above the first epitaxial S/D feature and a shallow portion disposed directly above the second epitaxial S/D feature,
- wherein the deep portion penetrates through the second ILD layer, the CESL, and the first ILD layer to land on the first epitaxial S/D layer,
- wherein the shallow portion penetrates through second ILD layer to land on the CESL,
- wherein the shallow portion has a greater width along the second direction than the deep portion.

18. The semiconductor structure of claim 17, wherein the S/D contact includes a fill metal of a first metal-containing conductive material and a conductive barrier layer of a second metal-containing conductive materials surrounding the fill metal, the first metal-containing and second metal-containing conductive materials are different in composition, and the fill metal spans continuously from a topmost surface of the deep portion to a bottommost surface of the deep portion.

19. The semiconductor structure of claim 17, wherein the deep portion has a first height, the shallow portion has a second height, and a ratio of the second height to the first height is about 0.4 to about 0.5.

20. The semiconductor structure of claim 19, wherein a separation distance between the CESL and a top surface of the second epitaxial S/D feature is at least about 5 nm.

* * * * *